(12) United States Patent
Zhang

(10) Patent No.: US 9,306,606 B2
(45) Date of Patent: Apr. 5, 2016

(54) NONLINEAR FILTERING USING POLYPHASE FILTER BANKS

(71) Applicant: The Boeing Company, Chicago, IL (US)

(72) Inventor: Deying Zhang, Oak Park, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/300,972

(22) Filed: Jun. 10, 2014

(65) Prior Publication Data

US 2015/0358042 A1 Dec. 10, 2015

(51) Int. Cl.
*H04B 1/10* (2006.01)
*H04J 1/16* (2006.01)

(52) U.S. Cl.
CPC ............. *H04B 1/1036* (2013.01); *H04J 1/16* (2013.01)

(58) Field of Classification Search
CPC .. H04B 7/0845; H04B 1/0017; H04L 27/148; H04L 27/2334; H04L 24/264; G10L 19/0208; G10L 21/0208; G10L 19/0204; G10L 19/265; G10L 21/038
USPC ................ 375/232, 343, 349–350; 704/205
See application file for complete search history.

(56) References Cited

U.S. PATENT DOCUMENTS

| | | | |
|---|---|---|---|
| 6,584,203 B2 * | 6/2003 | Elko et al. ................. 381/92 |
| 7,068,844 B1 * | 6/2006 | Javidi ................. G06K 9/00818 |
| | | | 382/209 |
| 7,149,257 B2 * | 12/2006 | Braithwaite ........ H03F 1/3247 |
| | | | 375/296 |
| 7,324,616 B2 * | 1/2008 | Sobchak et al. ............. 375/346 |
| 7,366,252 B2 * | 4/2008 | Cova ................... H03F 1/3247 |
| | | | 375/296 |
| 7,426,270 B2 * | 9/2008 | Alves et al. ............ 379/406.08 |
| 7,433,907 B2 * | 10/2008 | Nagai et al. .................. 708/300 |
| 7,813,496 B2 | 10/2010 | Kubin et al. |
| 7,818,079 B2 * | 10/2010 | Vaananen et al. ............... 700/94 |
| 8,548,614 B2 * | 10/2013 | Kirkeby ................. G10L 21/02 |
| | | | 381/102 |
| 8,818,541 B2 * | 8/2014 | Villemoes et al. ............. 700/94 |
| 2005/0018796 A1 * | 1/2005 | Sande et al. ................ 375/350 |
| 2006/0095269 A1 * | 5/2006 | Smith et al. ................... 704/500 |
| 2013/0010976 A1 * | 1/2013 | Schmidt et al. ................ 381/66 |
| 2013/0051571 A1 * | 2/2013 | Nagel et al. ..................... 381/56 |
| 2013/0090933 A1 * | 4/2013 | Villemoes et al. ............ 704/500 |
| 2013/0182870 A1 * | 7/2013 | Villemoes ....................... 381/99 |
| 2013/0339037 A1 * | 12/2013 | Liljeryd et al. .............. 704/500 |
| 2014/0081631 A1 * | 3/2014 | Zhu et al. ...................... 704/226 |
| 2014/0088978 A1 * | 3/2014 | Mundt et al. ................. 704/500 |
| 2014/0169501 A1 * | 6/2014 | Nazarathy et al. ............ 375/316 |
| 2014/0247953 A1 * | 9/2014 | Schmidt et al. ................ 381/92 |
| 2014/0276065 A1 * | 9/2014 | He et al. ........................ 600/445 |

(Continued)

OTHER PUBLICATIONS

Diniz, "Adaptive Filtering: Algorithms and Practical Implementation," Springer Science+Business Media, LLC, Third Edition, copyright 2008, 634 pages.

(Continued)

*Primary Examiner* — Emmanuel Bayard
(74) *Attorney, Agent, or Firm* — Yee & Associates, P.C.

(57) ABSTRACT

A method and apparatus for analyzing an input signal. A nonlinear filter system comprises a plurality of polyphase filter banks corresponding to a plurality of orders of nonlinearity. Each of the plurality of polyphase filter banks is configured to process an input signal with respect to a plurality of selected frequency subbands to generate an output signal that corresponds to a corresponding order of the each of the plurality of polyphase filter banks.

20 Claims, 24 Drawing Sheets

(56) References Cited

U.S. PATENT DOCUMENTS

| | | | |
|---|---|---|---|
| 2015/0032461 A1* | 1/2015 | Villemoes | 704/500 |
| 2015/0032788 A1* | 1/2015 | Velazquez et al. | 708/819 |
| 2015/0058025 A1* | 2/2015 | Villemoes et al. | 704/500 |
| 2015/0063589 A1* | 3/2015 | Yu et al. | 381/92 |
| 2015/0102927 A1* | 4/2015 | Johnson et al. | 340/539.14 |

OTHER PUBLICATIONS

Rugh, "Nonlinear System Theory: The Volterra/Wiener Approach," The Johns Hopkins University Press, copyright 1981, web version prepared in 2002, 338 pages.

Benedetto et al., "Modeling and Performance Evaluation of Nonlinear Satellite Links—A Voterra Series Approach," IEEE Transactions on Aerospace and Electronic Systems, vol. AES-15, No. 4, Jul. 1079, pp. 494-507.

Saleh et al., "Adaptive Linearization of Power Amplifiers in Digital Radio Systems," American Telephone and Telegraph Company, The Bell System Technical Journal, vol. 62, No. 4, Apr. 1983, pp. 1019-1033.

Zhu et al., "Digital Predistortion for Envelope-Tracking Power Amplifiers Using Decomposed Piecewise Volterra Series," IEEE Transactions on Microwave Theory and Techniques, vol. 56, No. 10, Oct. 2008, pp. 2237-2247.

Anttila et al., "Joint Mitigation of Power Amplifier and I/Q Modulator Impairments in Broadband Direct-Conversion Transmitters," IEEE Transactions on Microwave Theory and Techniques, vol. 58, No. 4, Apr. 2010, pp. 730-739.

Nowak, "VOlterra Filter Equalization: A Fixed Point Approach," IEEE Transactions on Signal Processing, vol. 45, No. 2, Feb. 1997, pp. 377-388.

Giannakis, et al., "Linear Multichannel Blind Equalizers of Nonlinear FIR Volterra Channels," IEEE Transactions on Signal Processing, vol. 45, No. 1, Jan. 1997, pp. 67-81.

Narayanan, "Transistor Distortion Analysis Using Volterra Series Representation," The Bell System Technical Journal, May-Jun. 1967, pp. 991-1024.

Wang et al., "Volterra-Mapping-Based Behavioral Modeling on Nonlinear Circuits and Systems for High Frequencies," IEEE Transactions on Microwave Theory and Techniques, vol. 51, No. 5, May 2003, pp. 1433-1440.

Lang et al., "Output frequency response function of nonlinear Volterra systems," Automatica, vol. 43, No. 5, May 2007, pp. 805-816.

Lee et al., "A Fast Recursive Least Squares Adaptive Second-Order Volterra Filter and Its Performance Analysis," IEEE Transactions on Signal Processing, vol. 41, No. 3, Mar. 1993, pp. 1087-1102.

Harris et al., "Digital Receivers and Transmitters Using Polyphase Filter Banks for Wireless Communications," IEEE Transactions on Microwave Theory and Techniques, vol. 51, No. 4, Apr. 2003, pp. 1395-1412.

Vetterli, "A Theory of Multirate Filter Banks," IEEE Transactions on Acoustics, Speech, and Signal Processing, vol. ASSP-35, No. 3, Mar. 1987, pp. 356-372.

Lee et al., "Subband Adaptive Filtering: Theory and Implementation," John Wiley & Sons, Ltd., copyright 2009, 346 pages.

Ogunfunmi, "Adaptive Nonlinear System Identification: The Volterra and Wiener Model Approaches," Springer Science+Business Media, LLC, copyright 2007, 238 pages.

Borys, "Nonlinear Aspects of Telecommunications: Discrete Volterra Series and Nonlinear Echo Cancellation," CRC Press, LLC, copyright 2001, 297 pages.

Luo, "Digital Front-End in Wireless Communications and Broadcasting: Circuits and Signal Processing," Cambridge University Press, copyright 2011, 789 pages.

Cavers, "The Effect of Quadrature Modulator and Demodulator Errors on Adaptive Digital Predistorters for Amplifier Linearization," IEEE Transactions on Vehicular Technology, vol. 46, No. 2, May 1997, pp. 456-466.

Bassam et al., "Crossover Digital Predistorters for the Compensation of Crosstalk and Nonlinearity in MIMO Transmitters," IEEE Transactions on Microwave Theory and Techniques, vol. 57, No. 5, May 2009, pp. 1119-1128.

Burton et al., "Nonlinear System Identification Using a Subband Adaptive Volterra Filter," IEEE Transactions on Instrumentation and Measurement, vol. 58, No. 5, May 2009, pp. 1389-1397.

Carini et al., "V-Vector Algebra and Its Application to Volterra-Adaptive Filtering," IEEE Transactions on Circuits and Systems—II: Analog and Digital Signal Processing, vol. 46, No. 5, May 1999, pp. 585-598.

Sicuranza et al., "A Multichannel Hierarchical Approach to Adaptive Volterra Filters Employing Filtered-X Affine Projection Algorithms," IEEE Transactions on Signal Processing, vol. 53, No. 4, Apr. 2005, pp. 1463-1473.

Schwingshackl et al., "Polyphase Representation of Multirate Nonlinear Filters and Its Applications," IEEE Transactions on Signal Processing, vol. 55, No. 5, May 2007, pp. 2145-2157.

* cited by examiner

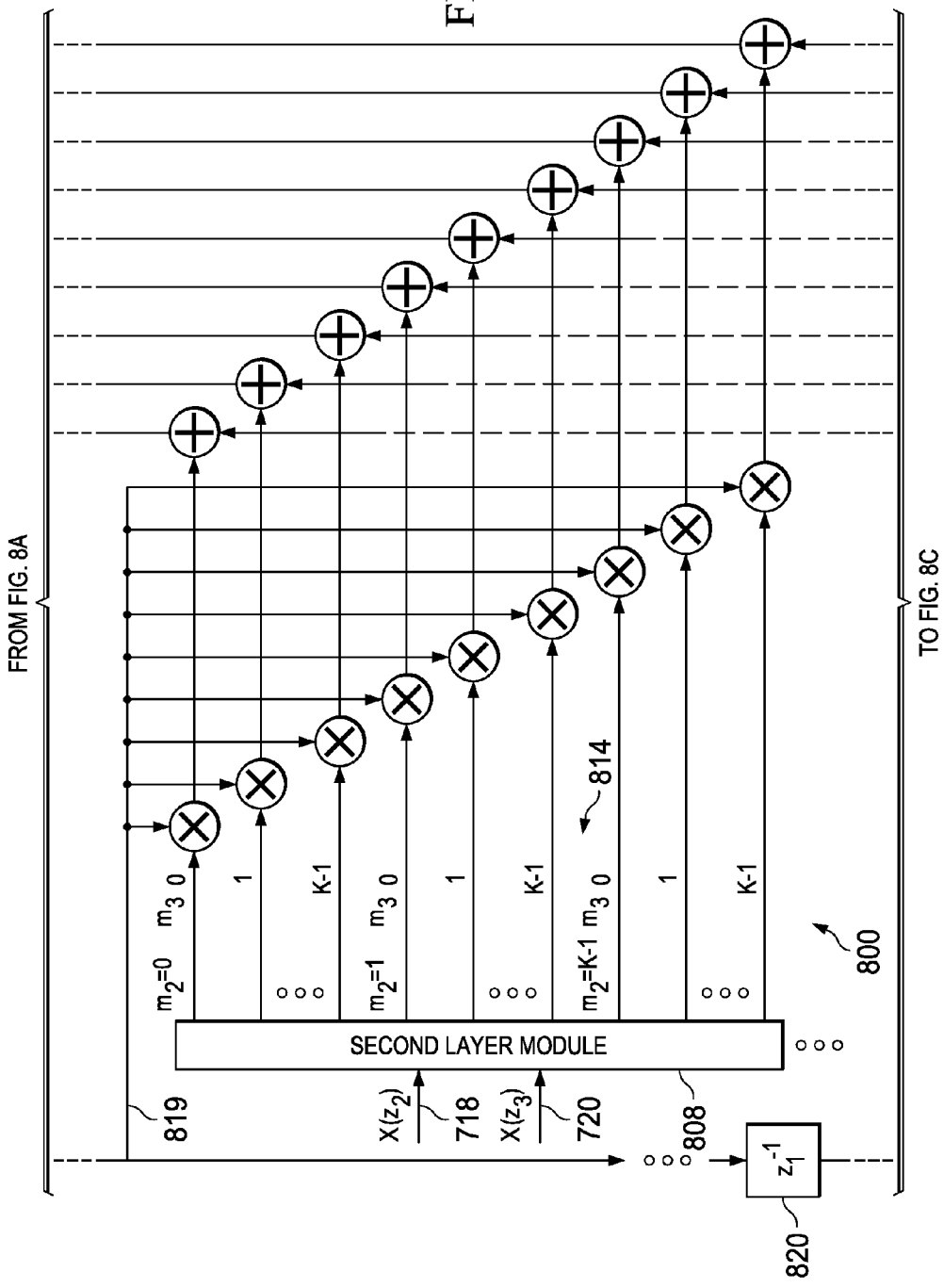

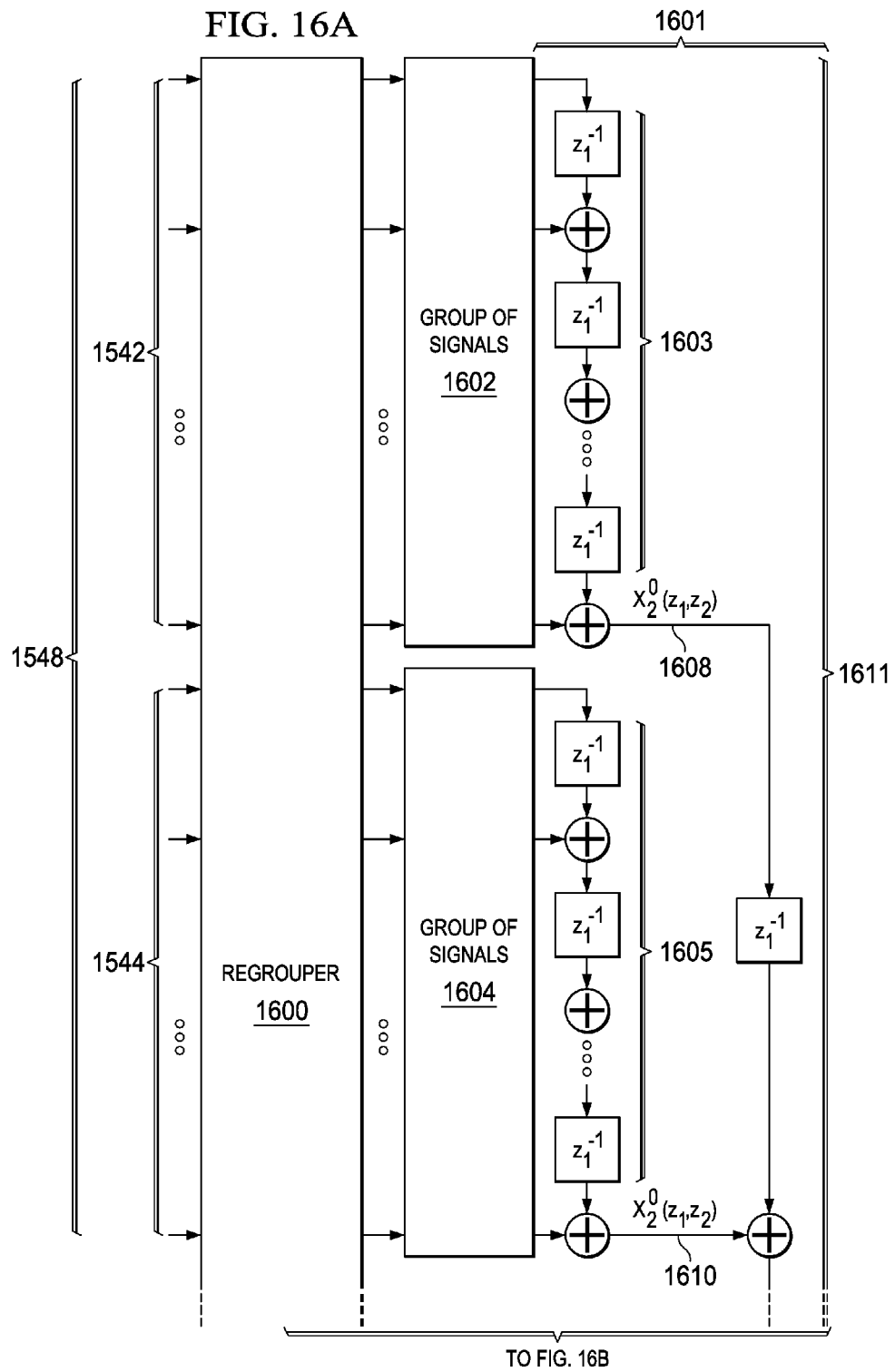

NONLINEAR FILTERING USING POLYPHASE FILTER BANKS

BACKGROUND INFORMATION

1. Field

The present disclosure relates generally to filtering and, in particular, to nonlinear filtering in digital signal processing. Still more particularly, the present disclosure relates to an apparatus, system, and method for implementing a nonlinear filter system for digital signal processing using polyphase filter banks.

2. Background

Digital signal processing (DSP) software and hardware is widely used in various systems. Typically, an analog signal is received through a channel and then sent into an analog to digital converter (ADC). The analog to digital converter converts the input signal into a digital signal. The digital signal is then processed using digital signal processing software, hardware, or a combination of the two.

An ideal system may be a linear system in which every portion of the path of the input signal from the source of the input signal to the input end of the analog to digital converter is substantially linear. Linear filtering may be used to correct for any linear distortion, adaptively cancel out noise, channelize the input signal, or some combination thereof. However, complex systems may not be linear. In other words, nonlinearity may be introduced along the path of the input signal. This nonlinearity may be caused by, for example, without limitation, the type of electronic hardware being used, the channel medium used to carry the input signal, bandwidth limitations in the analog to digital converter, quantization errors in the analog to digital converter, or some combination thereof.

Having a filtering system capable of reducing undesired nonlinear effects to improve system performance may be desirable. In particular, it may be desirable to have a filtering technique capable of analyzing an input signal, synthesizing an output signal, or both in a manner that reduces undesired nonlinear effects. However, some conventional techniques may be unable to reduce undesired nonlinear effects with a desired level of accuracy. Because models of nonlinear behavior are often expressed as higher order polynomials, designing filters based on these models may be more difficult and complex than desired.

Although some nonlinear filtering techniques are currently available, these filtering techniques may be unable to achieve high order harmonic interference separation from the signals of interest in nonlinear systems. Further, these filtering techniques may be unable to achieve the level of performance needed for use in transmultiplexing or subband coding. As used herein, transmultiplexing is the conversion of time multiplexed components of a signal to a frequency multiplexed version and back. Subband coding is the decomposition of a signal into different frequency components and the subsequent encoding of those frequency components. Therefore, it would be desirable to have a method and apparatus that take into account at least some of the issues discussed above, as well as other possible issues.

SUMMARY

In one illustrative embodiment, a method for analyzing an input signal is provided. The input signal is received at an analysis filter system comprising a plurality of analysis filter banks corresponding to a plurality of orders of nonlinearity. The input signal has a bandwidth. The input signal is decomposed, by each of the plurality of analysis filter banks, into a plurality of output subband signals to form a nonlinear component of the input signal that corresponds to a corresponding order of nonlinearity in the plurality of orders of nonlinearity of the each of the plurality of analysis filter banks. Each of the plurality of output subband signals is for a different frequency subband within the bandwidth of the input signal.

In another illustrative embodiment, a method for synthesizing an output signal is provided. A nonlinear input component comprising a plurality of input subband signals for selected frequency subbands is received at each of a plurality of synthesis filter banks in a synthesis filter system. The plurality of synthesis filter banks corresponds to a plurality of orders of nonlinearity. An output component that corresponds to a corresponding order of the each synthesis filter bank is formed, by each synthesis filter bank in the plurality of synthesis filter banks, using the nonlinear input component received at the each synthesis filter bank. The output component formed by the each synthesis filter bank in the plurality of synthesis filter banks is combined to form the output signal. The output signal has a bandwidth that includes all of the selected frequency subbands.

In yet another illustrative embodiment, an apparatus comprises a plurality of polyphase filter banks corresponding to a plurality of orders of nonlinearity. Each of the plurality of polyphase filter banks is configured to receive an input signal having a bandwidth. Each of the plurality of analysis filter banks is configured to process an input signal with respect to a plurality of selected frequency subbands to generate an output signal that corresponds to a corresponding order of the each of the plurality of polyphase filter banks.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIGS. 8A, 8B, and 8C are illustrations of a functional block diagram of a third layer analysis filter in accordance with an illustrative embodiment;

FIGS. 16A and 16B are illustrations of a functional block diagram of a third portion of a second order synthesis filter bank in accordance with an illustrative embodiment;

DETAILED DESCRIPTION

The illustrative embodiments recognize and take into account different considerations. For example, the illustrative embodiments recognize and take into account that it may be desirable to have a filter system capable of processing the signals for a nonlinear system with respect to multiple orders of nonlinearity and different frequency subbands for each of these orders of nonlinearity.

The illustrative embodiments provide an apparatus, a system, and a method for implementing a nonlinear filter system for use in at least one of nonlinear signal analysis, nonlinear signal synthesis, or nonlinear signal component separation. In particular, the illustrative embodiments provide a nonlinear filter system that uses polyphase filter banks to implement a nonlinear filter system for a nonlinear system. Further, the nonlinear filter system may use polyphase filter banks that use the discrete Fourier transformation (DFT) technique. In these illustrative examples, the polyphase filter banks may be used to implement a nonlinear filter system for a nonlinear system that may be modeled using, for example, without limitation, the Volterra series.

Using polyphase filter banks that use the discrete Fourier transformation technique may allow high order harmonic interference to be separated from the signal of interest in a nonlinear system. Further, high order statistics for the signal may also be separated for analysis or synthesis using these types of polyphase filter banks.

Still further, these polyphase filter banks may be capable of performing at the level needed for use in transmultiplexing and subband coding. Consequently, a nonlinear filter system implemented using these types of polyphase filter banks may be used to implement a transmultiplexer in which undesired nonlinear effects that occur during power amplification, channel identification, channel equalization, and other digital signal processing operations are reduced. Further, this type of nonlinear filter system may be implemented in subband coding for use in noise and echo cancellation, nonlinearity compensation, and fault detection, diagnosis and prognosis.

Figure 1:
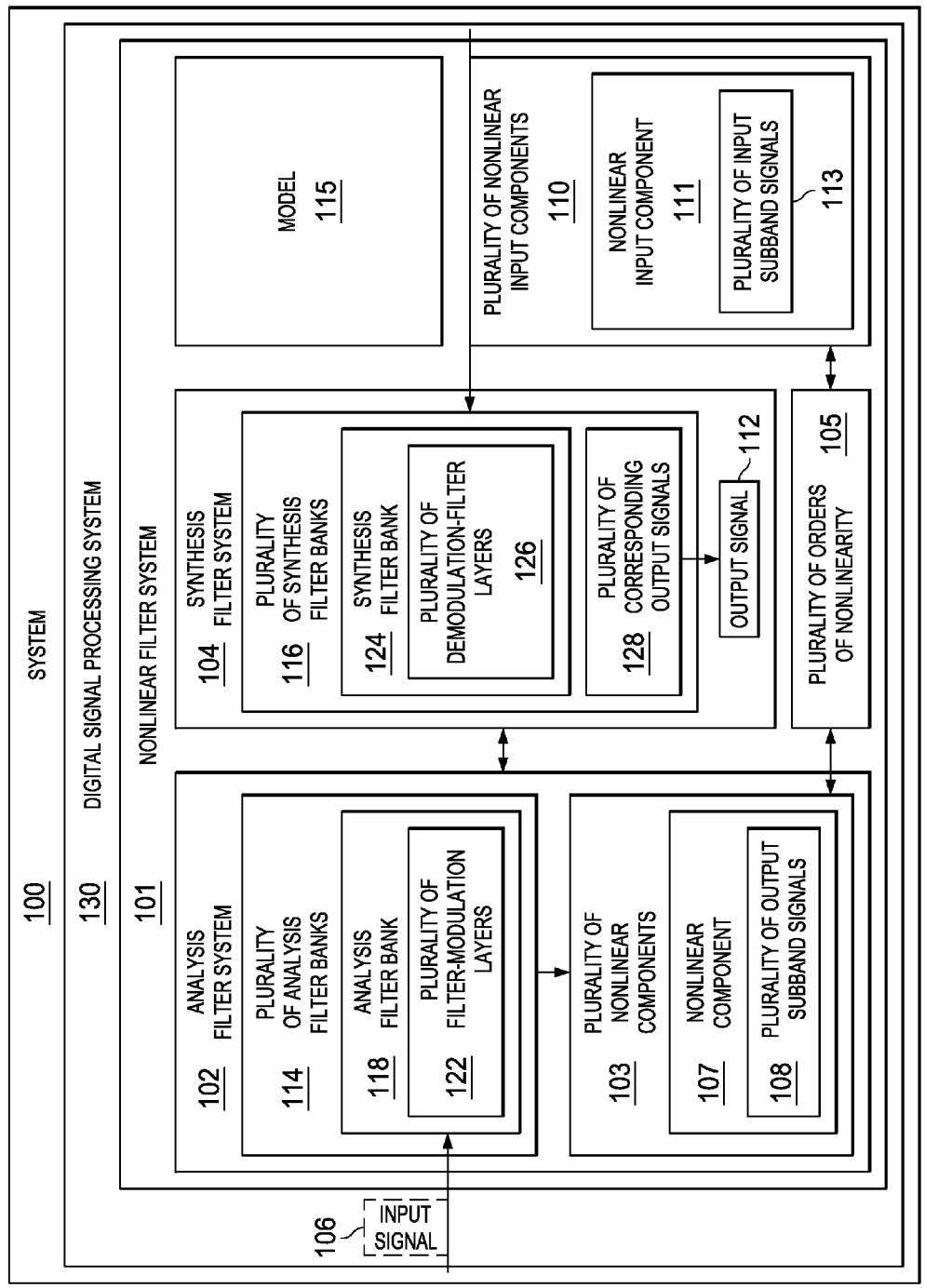
FIG. 1 is an illustration of a nonlinear filter system for a system in the form of a block diagram in accordance with an illustrative embodiment.

Referring now to the figures and, in particular, with reference to FIG. 1, an illustration of a nonlinear filter system for a system is depicted in the form of a block diagram in accordance with an illustrative embodiment. In FIG. 1, system 100 may take a number of different forms. In one illustrative example, system 100 may take the form of a transmitter, a receiver, a transceiver, or some other type of hardware system or device. A transceiver is a device that includes both a transmitter and a receiver.

System 100 may include nonlinear filter system 101. Nonlinear filter system 101 is a hardware system that may also include software components, firmware components, or a combination of the two. For example, nonlinear filter system 101 may be implemented using at least one of low-pass filters, high-pass filters, band-pass filters, or some other type of filters. These filters may be implemented using at least one of electronic components, mechanical components, electromechanical components, optical components, waveguides, or some other types of component.

As used herein, the phrase "at least one of," when used with a list of items, means different combinations of one or more of the listed items may be used and only one of the items in the list may be needed. The item may be a particular object, thing, action, process, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Nonlinear filter system 101 is configured to allow at least one of signal analysis or signal synthesis. For example, nonlinear filter system 101 may include analysis filter system 102, synthesis filter system 104, or both. Analysis filter system 102 may be used to decompose input signal 106 into plurality of nonlinear components 103 for plurality of orders of nonlinearity 105 for analysis.

Each of plurality of nonlinear components 103 may comprise a plurality of output subband signals. Nonlinear component 107 may be an example of one of plurality of nonlinear components 103. Nonlinear component 107 may include plurality of output subband signals 108. A nonlinear component in plurality of nonlinear components 103 may also be referred to as a nonlinear output component.

Each output subband signal in plurality of output subband signals 108 corresponds to a different subband in the overall frequency band of input signal 106. As used herein, a "subband" is a range of frequencies within an overall frequency band. In one illustrative example, the overall frequency band of input signal 106 may be divided substantially equally into, for example, K subbands. In this manner, each of plurality of output subband signals 108 is for a different frequency subband within the bandwidth of input signal 106.

Synthesis filter system 104 may be used to synthesize output signal 112 using plurality of nonlinear input components 110 for plurality of orders of nonlinearity 105. Nonlinear input component 111 may be an example of one of plurality of nonlinear input components 110.

Nonlinear input component 111 may include plurality of input subband signals 113. Each of plurality of input subband signals 113 is for a different frequency subband within the total bandwidth selected for output signal 112. In some cases, each of plurality of input subband signals 113 may be referred to as an input subband component or a subband component.

Plurality of orders of nonlinearity 105 may include a first order, a second order, and zero or more other orders of nonlinearity. For example, without limitation, plurality of orders of nonlinearity 105 may include a first order, a second order, a third order, and up to a $j^{th}$ order.

In some illustrative examples, plurality of nonlinear components 103 formed by analysis filter system 102 may be used as the input for synthesis filter system 104. In other words, plurality of nonlinear components 103 may be used as plurality of nonlinear input components 110. Consequently, output signal 112 formed by synthesis filter system 104 may be a reconstruction of input signal 106 that is decomposed into plurality of nonlinear components 103 by analysis filter system 102.

In some illustrative examples, output signal 112 formed by synthesis filter system 104 may be used as the input for analysis filter system 102. In other words, output signal 112 may be used as input signal 106 in these examples. Consequently, plurality of nonlinear components 103 formed by analysis filter system 102 may be a decomposition of output signal 112 formed by synthesis filter system 104.

Analysis filter system 102 and synthesis filter system 104 may be designed based on model 115. Model 115 may model the nonlinearity of system 100 with a desired level of accuracy. The accuracy of model 115 may allow analysis filter system 102 and synthesis filter system 104 to be designed such that the undesired nonlinear effects in system 100 are reduced to within selected tolerances. In one illustrative example, model 115 may be the Volterra model. The Volterra model may be, for example, the Volterra series. Of course, in some other illustrative examples, some other type of model of nonlinear behavior may be used.

With the Volterra model, the output of the nonlinear system, y[k], for the given input signal, x[k], is given as follows:

$$y[k] = \sum_{l_1=-\infty}^{+\infty} h_1[l_1]x[k-l_1] + \sum_{l_1=-\infty}^{+\infty}\sum_{l_2=-\infty}^{+\infty} h_2[l_1, l_2]x[k-l_1]x[k-l_2] + \quad (1)$$

$$\sum_{l_1=-\infty}^{+\infty}\sum_{l_2=-\infty}^{+\infty}\sum_{l_3=-\infty}^{+\infty} h_3[l_1, l_2, l_3]x[k-l_1]$$

$$x[k-l_2]x[k-l_3] \ldots \sum_{l_1=-\infty}^{+\infty}\sum_{l_2=-\infty}^{+\infty} \ldots$$

$$\sum_{l_3=-\infty}^{+\infty}[l_1, l_2, \ldots, l_j]x[k-l_1]x[k-l_2] \ldots x[k-l_j] +$$

$$\ldots \{h_j(l_1, l_2, \ldots, l_j), 1 \leq j \leq \infty\},$$

where $\{h_j(l_1, l_2, \ldots, l_j)\}$ is the set of $j^{th}$ order kernel coefficients for the nonlinear system, y[k], j is the order of nonlinearity, ∞ is infinity, and $l_i$ is the length of the filter corresponding to the $j^{th}$ order kernel. For limited length nonlinear systems, equation (1) may be rewritten as follows:

$$y[k] = \sum_{l_1=0}^{L_1-1} h_1[l_1]x[k-l_1] + \sum_{l_1=0}^{L_1-1}\sum_{l_2=0}^{L_2-1} h_2[l_1, l_2]x[k-l_1]x[k-l_2] + \quad (2)$$

$$\sum_{l_1=0}^{L_1-1}\sum_{l_2=0}^{L_2-1}\sum_{l_3=0}^{L_3-1} h_3[l_1, l_2, l_3]x[k-l_1]x[k-l_2]$$

$$x[k-l_3] \ldots \sum_{l_1=0}^{L_1-1}\sum_{l_2=0}^{L_2-1} \ldots \sum_{l_j=0}^{L_j-1} h_j[l_1, l_2, \ldots, l_j]$$

$$x[k-l_1]x[k-l_2] \ldots x[k-l_j] + \ldots$$

where $L_j$ is the filter length of the $j^{th}$ order kernel.

When model 115 is the Volterra model, the Z-transform of the Volterra series expressed in equation (2) above may be expressed as follows:

$$Y(z_1, z_2, \ldots, z_j, \ldots) = H_1(z_1)X(z_1) + H_2(z_1, z_2)X(z_1)X(z_2) + H_3(z_1, z_2, z_3)X(z_1)X(z_2)X(x_3) + \ldots + H_j(z_1, z_2, \ldots, z_j)X(z_1)X(z_2) \ldots X(z_j) + \ldots \quad (3)$$

where, $$H_1(z_1) = \sum_{l_1=0}^{L_1-1} h_1[l_1]z_1^{-l_1}, \quad (4)$$

$$H_2(z_1, z_2) = \sum_{l_1=0}^{L_1-1}\sum_{l_2=0}^{L_2-1} h_2[l_1, l_2]z_1^{-l_1}z_2^{-l_2}, \quad (5)$$

$$H_3(z_1, z_2, z_3) = \sum_{l_1=0}^{L_1-1}\sum_{l_2=0}^{L_2-1}\sum_{l_3=0}^{L_3-1} h_3[l_1, l_2, l_3]z_1^{-l_1}z_2^{-l_2}z_3^{-l_3}, \text{ and} \quad (6)$$

and $$H_j(z_1, z_2, \ldots, z_j) = \sum_{l_1=0}^{L_1-1}\sum_{l_2=0}^{L_2-1} \ldots \sum_{l_j=0}^{L_j-1} h_j[l_1, l_2, \ldots, l_j]z_1^{-l_1}z_2^{-l_2} \ldots z_j^{-l_j}, \quad (7)$$

where $Y(z_1, z_2, \ldots, z_j, \ldots)$ is the Z-transform of the output of the nonlinear system, y[k]; X(z) is the Z-transform of the input signal, x[k]; $z_j$ is a time delay; $H_1(z_1)$ is the Z-transform of the first order filter; $H_2(z_1, z_2)$ is the Z-transform of the second order filter; $H_3(z_1, z_2, z_3)$ is the Z-transform of the third order filter; and $H_j(z_1, z_2, \ldots, z_j)$ is the Z-transform of the $j^{th}$ order filter. In this manner, $H_i(z_i)$ is the Z-transform of the $i^{th}$ order filter.

The output of the different orders of a nonlinear filter system based on the Volterra model may then be expressed as follows:

$$Y_1(z_1) = H_1(z_1)X(z_1) \quad (8)$$

$$Y_2(z_1, z_2) = H_2(z_1, z_2)X(z_1, z_2) \quad (9)$$

$$Y_3(z_1, z_2, z_3) = H_3(z_1, z_2, z_3)X(z_1, z_2, z_3) \quad (10)$$

$$Y_j(z_1, z_2, \ldots, z_j) = H_j(z_1, z_2, \ldots, z_j)X(z_1, z_2, \ldots, z_j) \quad (11)$$

where $Y_1(z_1)$ is the output for the first order filter, $Y_2(z_1, z_2)$ is the output for the second order filter, $Y_3(z_1, z_2, z_3)$ is the output for the third order filter, and $Y_j(z_1, z_2, \ldots, z_j)$ is the output for the $j^{th}$ order filter. Thus, the total output of the nonlinear filter system is given as follows:

$$Y(z_1, z_2, \ldots, z_j, \ldots) = Y_1(z_1) + Y_2(z_1, z_2) + Y_3(z_1, z_2, z_3) + \ldots + Y_j(z_1, z_2, \ldots, z_j) + \ldots \quad (12)$$

Analysis filter system 102 and synthesis filter system 104 may use polyphase structures and the discrete Fourier transformation technique to implement the nonlinear filter system expressed in equation (12) above. In particular, each $i^{th}$ order filter may be implemented using a polyphase structure combined with the discrete Fourier transformation technique.

As depicted, analysis filter system 102 includes plurality of analysis filter banks 114. Each of plurality of analysis filter banks 114 is configured to receive input signal 106 as input. Further, each of plurality of analysis filter banks 114 corresponds to a different order of nonlinearity in plurality of orders of nonlinearity 105. For example, plurality of analysis filter banks 114 may include a first order analysis filter bank, a second order analysis filter bank, and zero or more high order analysis filter banks.

In this illustrative example, each of plurality of analysis filter banks 114 may be implemented using a polyphase structure. As used herein, a "polyphase structure" is a structure configured to handle different phase components. Further, each of plurality of analysis filter banks 114 may be implemented using a discrete Fourier transformation (DFT) technique. In this manner, each of plurality of analysis filter banks 114 may be a polyphase filter bank or a polyphase DFT filter bank.

In this illustrative example, synthesis filter system 104 includes plurality of synthesis filter banks 116. Each of plurality of synthesis filter banks 116 may receive a corresponding set of input subband signals as input. Further, each of plurality of synthesis filter banks 116 may include a first order synthesis filter bank, a second order synthesis filter bank, and zero or more high order synthesis filter banks.

In this illustrative example, each of plurality of synthesis filter banks 116 may be implemented using a polyphase structure. Further, each of plurality of synthesis filter banks 116 may be implemented using a discrete Fourier transformation (DFT) technique. In this manner, each of plurality of synthesis filter banks 116 may be a polyphase filter bank or a polyphase DFT filter bank.

In one illustrative example, analysis filter bank 118 may be an example of one of plurality of analysis filter banks 114. Analysis filter bank 118 may be a first order filter bank, a second order filter bank, a third order filter bank, a fourth order filter bank, or some other order filter bank. In this illustrative example, analysis filter bank 118 may be of an order higher than a first order.

Analysis filter bank 118 may be implemented using plurality of filter-modulation layers 122. A particular layer in plurality of filter-modulation layers 122 may include a sub-layer of filtering and a subsequent sub-layer of modulation. In other words, the particular layer in plurality of filter-modulation layers 122 may include a filtering operation followed by a modulation operation. Further, the particular layer may include a plurality of filters equal in number to K subbands and a set of modulators having a number corresponding to an index of the particular layer and K.

The number of layers in plurality of filter-modulation layers 122 may correspond to the order of analysis filter bank 118. For example, when analysis filter bank 118 is a second order filter bank, plurality of filter-modulation layers 122 includes two layers. When analysis filter bank 118 is a third order filter bank, plurality of filter-modulation layers 122 includes three layers. In this manner, when analysis filter bank 118 is an $i^{th}$ order filter bank, plurality of filter-modulation layers 122 includes i layers.

Analysis filter bank 118 receives input signal 106 and outputs a corresponding nonlinear component, such as nonlinear component 107. Analysis filter bank 118 allows the nonlinear component of input signal 106 corresponding to a particular order of nonlinearity to be analyzed with respect to multiple frequency subbands. In this manner, analysis filter bank 118 may be referred to as a polyphase analysis filter bank. Further, plurality of analysis filter banks 114 may be referred to as a plurality of polyphase analysis filter banks.

Synthesis filter bank 124 may be an example of one of plurality of synthesis filter banks 116. Depending on the implementation, synthesis filter bank 124 may be a first order synthesis filter bank, a second order filter bank, a third order filter bank, a fourth order filter bank, or some other order filter bank. Synthesis filter bank 124 allows a nonlinear input component that comprises a plurality of subband components and that corresponds to a particular order of nonlinearity to be analyzed with respect to multiple frequency subbands. In this manner, synthesis filter bank 124 may be referred to as a polyphase synthesis filter bank. Further, plurality of synthesis filter banks 116 may be referred to as a plurality of polyphase synthesis filter banks.

As depicted, synthesis filter bank 124 may be implemented using plurality of demodulation-filter layers 126. The number of layers in plurality of demodulation-filter layers 126 may correspond to the order of synthesis filter bank 124. For example, when synthesis filter bank 124 is a second order filter bank, plurality of demodulation-filter layers 126 includes two layers. When synthesis filter bank 124 is a third order filter bank, plurality of demodulation-filter layers 126 includes three layers.

In this manner, when synthesis filter bank 124 is an $i^{th}$ order filter bank, plurality of demodulation-filter layers 126 includes i layers. A particular layer in plurality of demodulation-filter layers 126 may include a sub-layer of demodulation and a subsequent sub-layer of filtering. In other words, the particular layer in plurality of demodulation-filter layers 126 may include a modulation operation followed by a filtering operation. Further, the particular layer may include a set of modulators having a number corresponding to an index of the particular layer and K and a plurality of filters equal in number to K. K is a total number of the selected frequency subbands and each of the plurality of filters is configured to form a filtered signal.

Synthesis filter bank 124 receives a corresponding nonlinear component, such as nonlinear input component 111. In response to receiving nonlinear input component 111, which may comprise plurality of input subband signals 113, synthesis filter bank 124 outputs a corresponding output signal.

In this manner, plurality of synthesis filter banks 116 may output plurality of corresponding output signals 128. Plurality of corresponding output signals 128 may be combined by synthesis filter system 104 to form output signal 112, which is a final output signal.

Examples of implementations for different types of analysis filter banks and synthesis filter banks are described in the figures below. Each of these filter banks uses a polyphase structure and the discrete Fourier transformation technique.

In this illustrative example, nonlinear filter system 101 may be implemented within, for example, digital signal processing system 130. Digital signal processing system 130 may be comprised of hardware, firmware, software, or some combination thereof.

Depending on the implementation, digital signal processing system 130 may be configured to receive input signal 106 as a digital signal or convert an analog signal received at digital signal processing system 130 into a digital signal to form input signal 106. For example, digital signal processing system 130 may include an analog to digital converter for converting the analog signal into the digital signal. The analog signal may be, for example, without limitation, a continuous, real-world analog signal. The analog signal may take the form of, for example, without limitation, an electrical signal, an optical signal, a radio signal, an electromagnetic signal, or some other type of signal.

Further, depending on the implementation, digital signal processing system 130 may be configured to send output signal 112 out as a digital signal or convert output signal 112 into an analog signal for transmission. For example, digital signal processing system 130 may include a digital to analog converter for converting the digital signal into the analog signal. The analog signal may be, for example, without limitation, a continuous, real-world analog signal. The analog signal may take the form of, for example, without limitation, an electrical signal, an optical signal, a radio signal, an electromagnetic signal, or some other type of signal. The analog signal may then be transmitted.

The illustration of nonlinear filter system 101 for system 100 in FIG. 1 is not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

Figure 2:
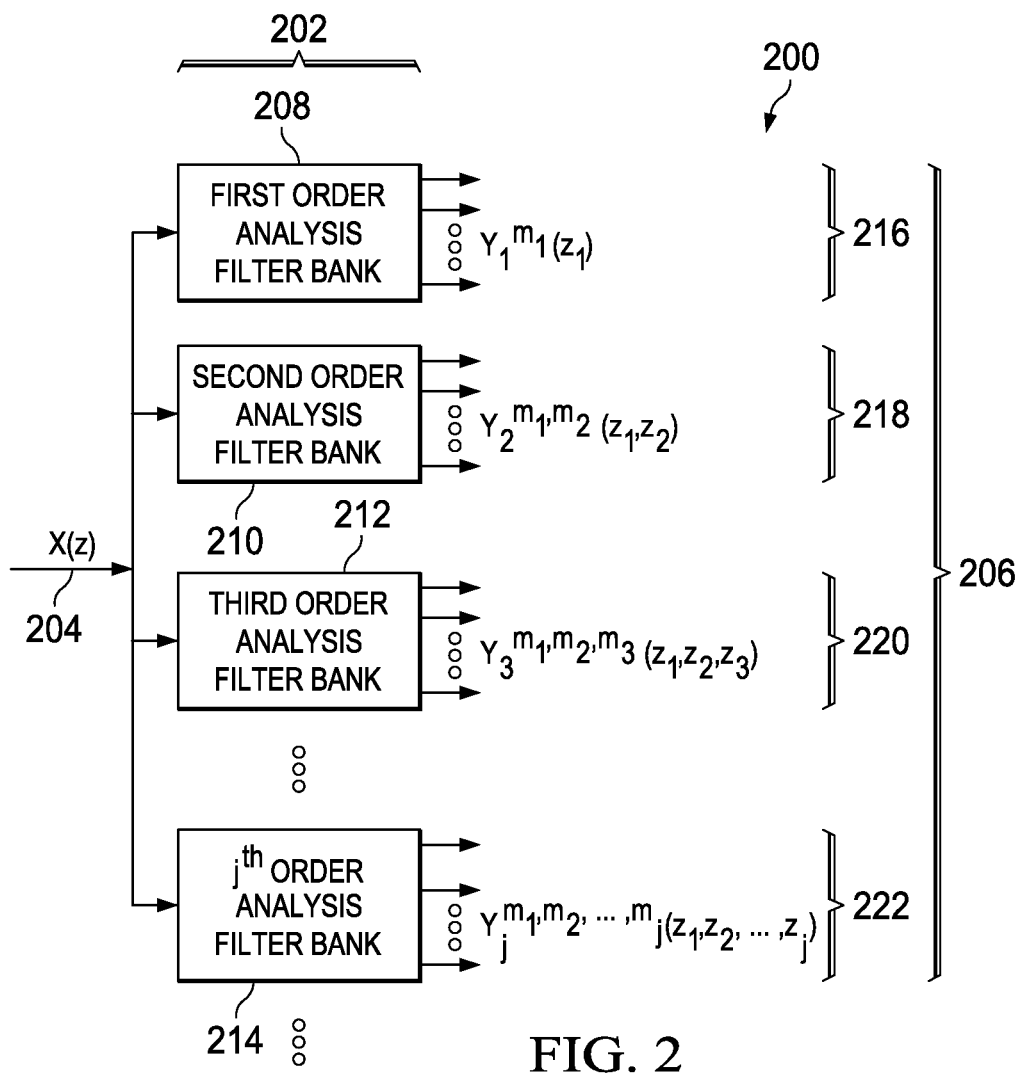
FIG. 2 is an illustration of a functional block diagram of an analysis filter system in accordance with an illustrative embodiment.

With reference now to FIG. 2, an illustration of a functional block diagram of an analysis filter system is depicted in accordance with an illustrative embodiment. In this illustrative example, analysis filter system 200 is an example of one implementation for analysis filter system 102 in FIG. 1. Analysis filter system 200 may represent the mathematical operations performed by a digital signal processor system, such as digital signal processing system 130 in FIG. 1.

As depicted, analysis filter system 200 includes plurality of analysis filter banks 202, which may be an example of one implementation for plurality of analysis filter banks 114 in FIG. 1. Each of plurality of analysis filter banks 202 receives input signal 204. Input signal 204 may be the digital form of a continuous, real-world, analog signal.

Plurality of analysis filter banks 202 includes first order analysis filter bank 208, second order analysis filter bank 210, third order analysis filter bank 212, and some number of other high order analysis filter banks up to $j^{th}$ order analysis filter bank 214. Plurality of analysis filter banks 202 generates plurality of nonlinear components 206. In particular, each of these analysis filter banks is configured to receive input signal 204 and generate a corresponding one of plurality of nonlinear components 206.

Plurality of nonlinear components 206 may be an example of one implementation for plurality of nonlinear components 103 in FIG. 1. First order analysis filter bank 208, second order analysis filter bank 210, and third order analysis filter bank 212 may receive input signal 204 and generate first order nonlinear component 216, second order nonlinear component 218, and third order nonlinear component 220, respectively.

Similarly, $j^{th}$ order analysis filter bank 214 generates $j^{th}$ order nonlinear component 222. In this manner, any $i^{th}$ order analysis filter banks in plurality of analysis filter banks 202 between third order analysis filter bank 212 and $j^{th}$ order analysis filter bank 214 may receive input signal 204 and generate $i^{th}$ order nonlinear component 222.

In this illustrative example, each of plurality of nonlinear components 206 may comprise a corresponding plurality of output subband signals. In particular, the plurality of output subband signals of each nonlinear component in plurality of nonlinear components 206 may include K signals for K subbands.

Examples of implementations for analysis filter banks that may be included in plurality of analysis filter banks 202 are described in FIGS. 3-11 below. In particular, an example of one implementation for first order analysis filter bank 208 in FIG. 2 is described in FIG. 3 below. An example of one implementation for second order analysis filter bank 210 is described in FIGS. 4-6 below. An example of one implementation for third order analysis filter bank 212 is described in FIGS. 7-11 below.

Figure 3:
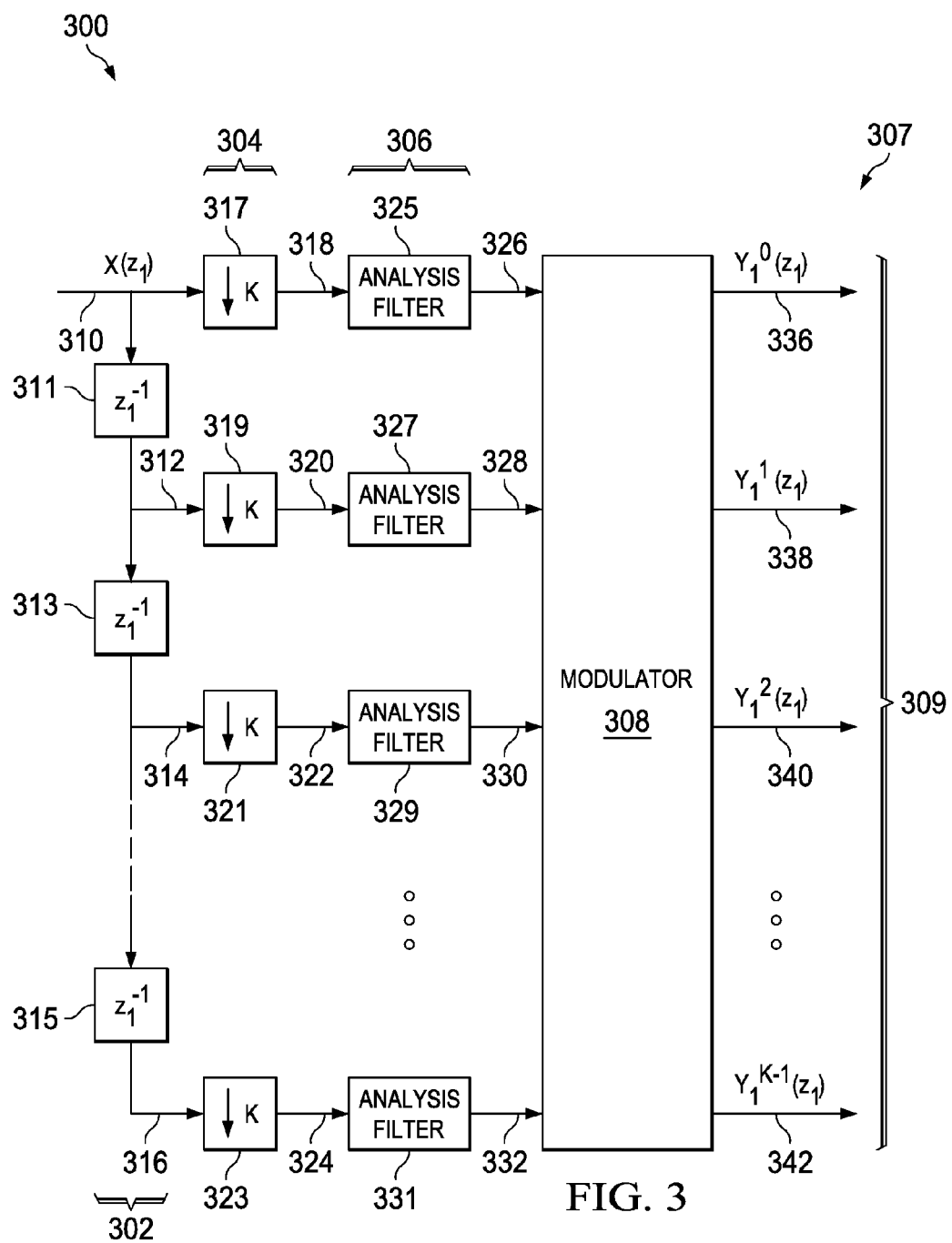
FIG. 3 is an illustration of a functional block diagram of a first order analysis filter bank in accordance with an illustrative embodiment.

With reference now to FIG. 3, an illustration of a functional block diagram of a first order analysis filter bank is depicted in accordance with an illustrative embodiment. In this illustrative example, first order analysis filter bank 300 is an example of one implementation for first order analysis filter bank 208 in FIG. 2. First order analysis filter bank 300 is a polyphase filter bank. As depicted, first order analysis filter bank 300 includes set of time shifters 302, set of downsamplers 304, set of analysis filters 306, and modulator 308.

First order analysis filter bank 300 produces first order nonlinear component 307 in response to receiving input signal 310. First order nonlinear component 307 includes plurality of output subband signals 309. Plurality of output subband signals 309 is a plurality of first order subband signals.

In this illustrative example, plurality of output subband signals 309 includes K signals for K subbands. The K subbands selected may represent the polyphase aspect of first order analysis filter bank 300. In particular, the K subbands may be the selected frequency bands for analysis. In particular, the K subbands correspond to K phases. Each output subband signal in plurality of output subband signals 309 is for a different one of the K phases.

Set of time shifters 302 includes K-1 time shifters. In this manner, set of time shifters 302 is used to form K-1 time-shifted versions of input signal 310. Together, input signal 310 and the K-1 time-shifted versions of input signal 310 form a total of K signals.

As depicted, set of time shifters 302 includes first time shifter 311, second time shifter 313, and some number of time shifters up to K-1 time shifter 315. First time shifter 311 delays input signal 310 a first time by a selected time delay to form time-shifted signal 312. This selected time delay may be about $2\pi/K$. Second time shifter 313 may delay time-shifted signal 312 further by this selected time delay to form time-shifted signal 314. K-1 time shifter 315 may further delay any signal received by the selected time delay to form time-shifted signal 316.

Input signal 310 and the K-1 time-shifted versions of input signal 310 are sent into set of downsamplers 304. In this illustrative example, each of set of downsamplers 304 is configured to downsample by a selected downsampling rate, M. This selected downsampling rate, M, may be selected as equal to the number of subbands desired, which may be K in this illustrative example. Consequently, M equals K in this illustrative example. A signal received at a downsampler in set of downsamplers 304 is downsampled by K samples such that every $K^{th}$ sample is selected for processing.

Set of downsamplers 304 includes a downsampler corresponding to each of K subbands. In this illustrative example, set of downsamplers 304 includes downsampler 317, downsampler 319, downsampler 321, and some number of downsamplers up to downsampler 323. Input signal 310 is downsampled by downsampler 317 to form downsampled signal 318. Time-shifted signal 312 is downsampled by downsampler 319 to form downsampled signal 320, and time-shifted signal 314 is downsampled by downsampler 321 to form downsampled signal 322. Further, time-shifted signal 316 is downsampled by downsampler 323 to form downsampled signal 324. The different downsampled signals are sent as input into set of analysis filters 306.

Set of analysis filters 306 includes an analysis filter corresponding to each of K subbands. As depicted, set of analysis filters 306 includes analysis filter 325, analysis filter 327, analysis filter 329, and analysis filter 331. Downsampled signal 318, downsampled signal 320, downsampled signal 322, and downsampled signal 324 are sent into analysis filter 325, analysis filter 327, analysis filter 329, and analysis filter 331, respectively. Analysis filter 325, analysis filter 327, analysis filter 329, and analysis filter 331 perform filtering on the received downsampled signals to form filtered signal 326, filtered signal 328, filtered signal 330, and filtered signal 332, respectively. These filtering operations may be referred to as a sub-layer of filtering.

The impulse response of a particular analysis filter in set of analysis filters 306 corresponding to a particular subband is represented as follows:

$$F_1^{k_1} \quad (13)$$

$$(z_1^K) = [\, h_1[k_1] \quad h_1[k_1 + K] \quad h_1[k_1 + 2K] \quad \cdots \quad h_1[k_1 + (N_1 - 1)K]\,] \begin{bmatrix} 1 \\ z_1^{-K} \\ z_1^{-2K} \\ \vdots \\ z_1^{-(N_1-1)K} \end{bmatrix}$$

where $$k_1 = 0,1,2,\ldots,K-1, \quad (14)$$

$$n_1 = 0,1,2,\ldots,N_1-1, \text{ and} \quad (15)$$

where $k_1$ is the index of the particular subband corresponding to the particular analysis filter, $F_1^{k_1}(z_1^K)$ represents the impulse response of the particular analysis filter, $N_1$ is the total number of filter coefficients designed for the particular analysis filter, $h_1[k_1]$ represents the impulse response component for the $n_1=0$ filter coefficient, $h_1[k_1+K]$ represents the impulse response component for the $n_1=1$ filter coefficient, $h_1[k_1+2K]$ represents the impulse response component for the $n_1=2$ filter coefficient, and $h_1[k_1+(N_1-1)K]$ represents the impulse response component for the $n_1=N_1-1$ filter coefficient.

Filtered signal 326, filtered signal 328, filtered signal 330, and filtered signal 332 are sent into modulator 308 for modulation. Modulator 308 performs frequency modulation of these filtered signals using the discrete Fourier transformation technique to form plurality of output subband signals 309. In particular, modulator 308 uses a K-point discrete Fourier transformation matrix to modulate the filtered signals to form plurality of output subband signals 309.

As depicted, plurality of output subband signals 309 includes output subband signal 336, output subband signal 338, output subband signal 340, and output subband signal 342. Each of these output subband signals corresponds to a different $k_1$ subband.

The modulation operations performed by modulator 308 form a sub-layer of modulation. Together, the sub-layer of filtering performed by set of analysis filters 306 and the sub-layer of modulation performed by modulator 308 form a filter-modulation layer. This filter-modulation layer may be expressed as follows:

$$H_1^{m_1}(z_1) = \Sigma_{k_1=0}^{K-1} z_1^{-k_1} W_K^{-m_1 k_1} F_1^{k_1}(z_1^K) \quad (16)$$

where $H_1^{m_1}(z_1)$ is the Z-transform of first order analysis filter bank 300, $m_1$ indicates the modulation index for the first order, $z_1^{-k_1}$ is the delayed and downsampled version of the input signal for the filter-modulation layer, and $W_K^{-m_1 k_1}$ represents the discrete Fourier transformation.

Figure 4:
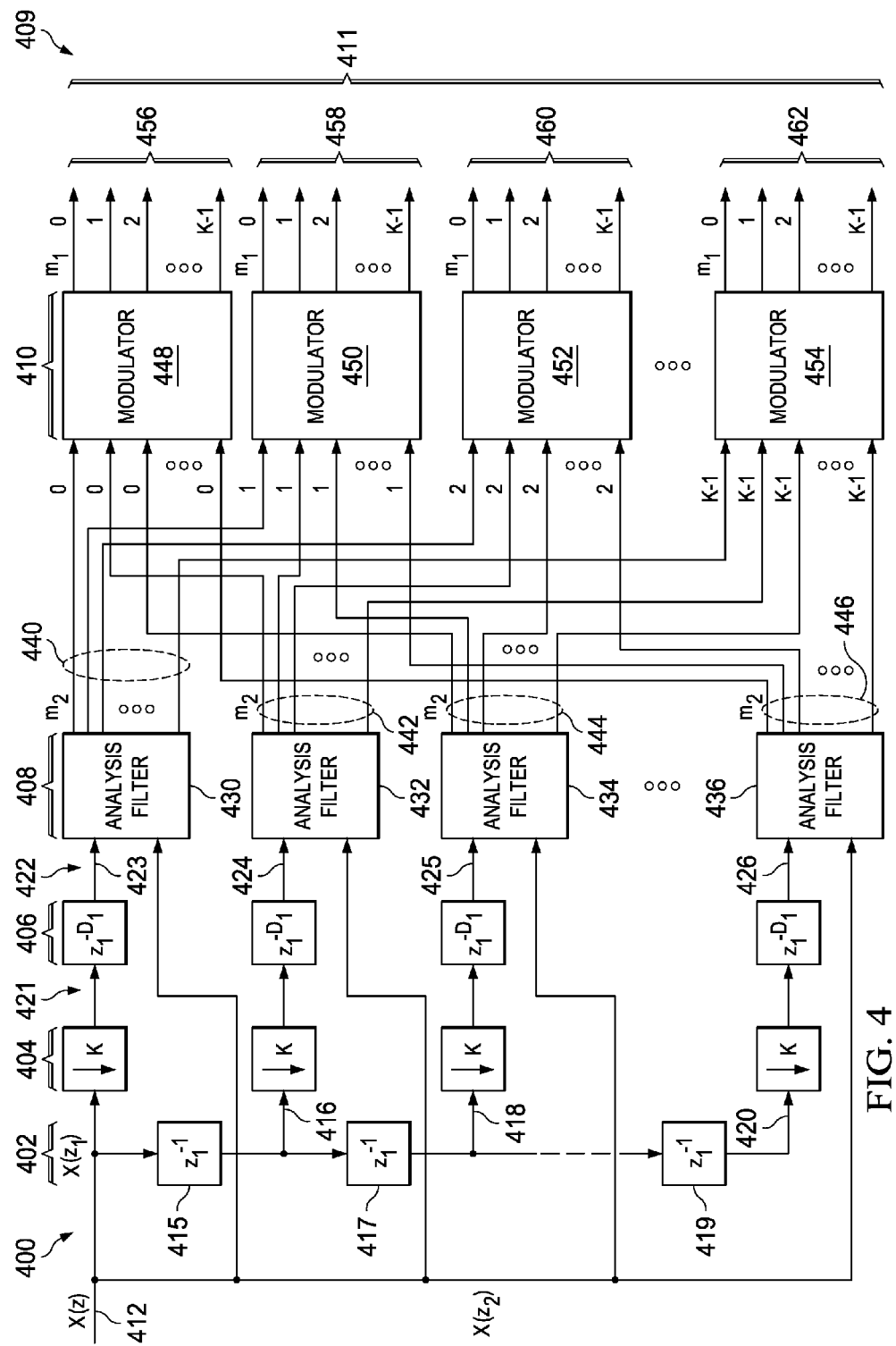
FIG. 4 is an illustration of a functional block diagram of a second order analysis filter bank in accordance with an illustrative embodiment.
Figure 5:
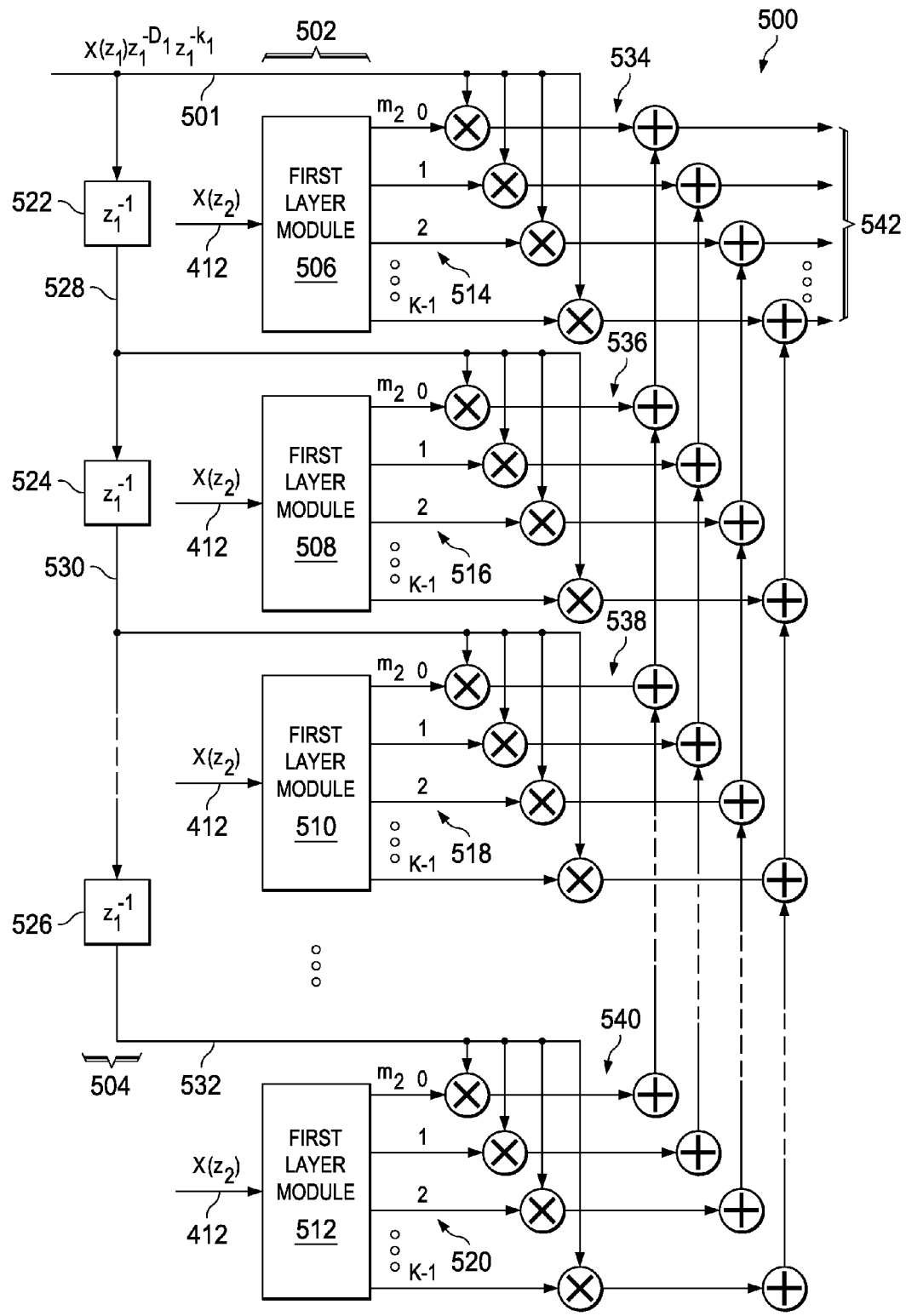
FIG. 5 is an illustration of a functional block diagram of a second layer analysis filter in accordance with an illustrative embodiment.
Figure 6:
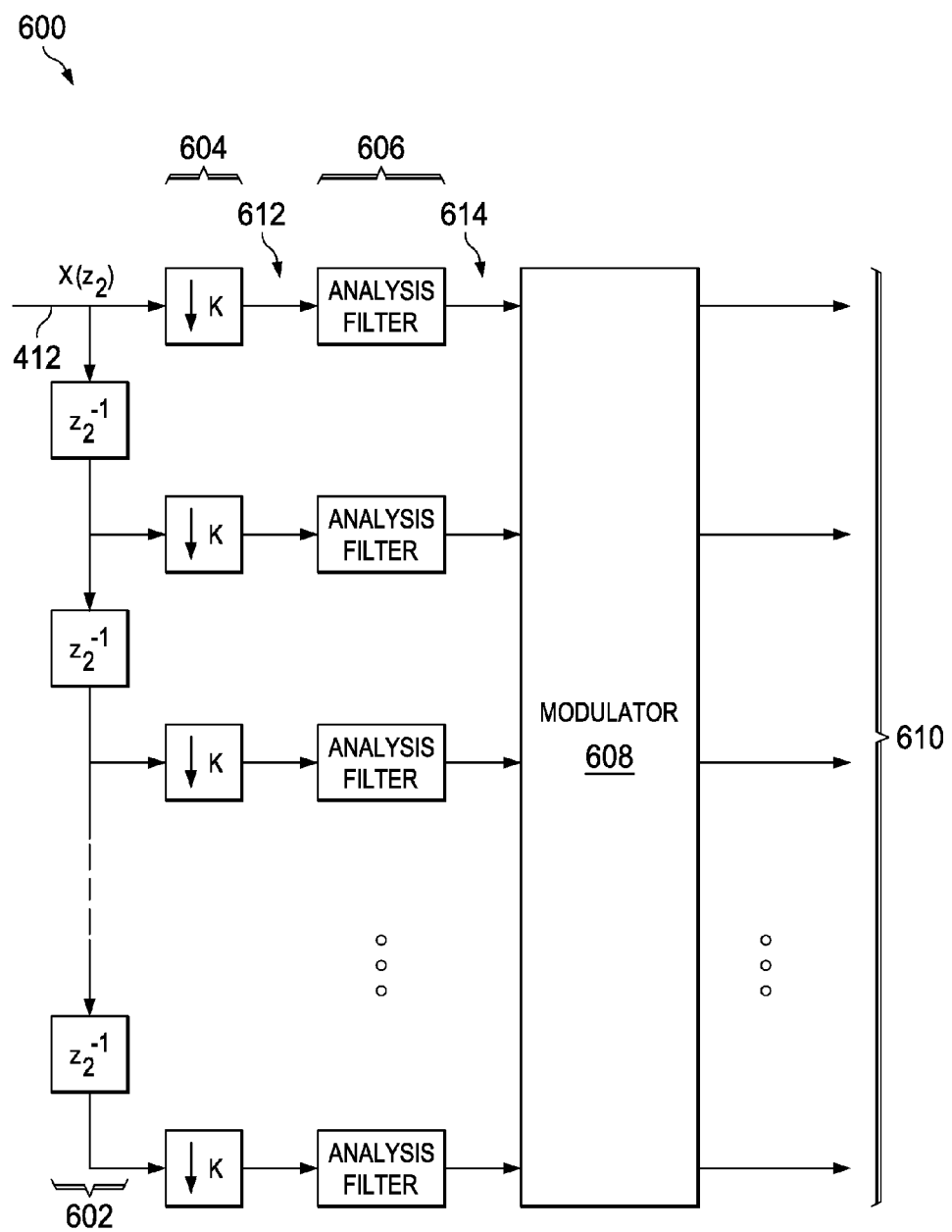
FIG. 6 is an illustration of a functional block diagram of a first layer module in accordance with an illustrative embodiment.

With reference now to FIGS. 4-6, illustrations of functional block diagrams for a second order analysis filter bank are depicted in accordance with an illustrative embodiment. In FIG. 4, the second filter-modulation layer of processing performed by second order analysis filter bank 400 is described and depicted. This second filter-modulation layer of processing may be performed with respect to the output of the first filter-modulation layer of processing described in FIGS. 5-6.

Turning now to FIG. 4, an illustration of a block diagram of a second order analysis filter bank is depicted in accordance with an illustrative embodiment. In this illustrative example, second order analysis filter bank 400 is an example of one implementation for second order analysis filter bank 210 in FIG. 2. Second order analysis filter bank 400 is a polyphase filter bank.

As depicted, second order analysis filter bank 400 includes set of time shifters 402, set of downsamplers 404, set of delay units 406, set of second layer analysis filters 408, and set of second layer modulators 410. Second order analysis filter bank 400 generates second order nonlinear component 409 in response to receiving input signal 412. Second order nonlinear component 409 comprises plurality of output subband signals 411. Plurality of output subband signals 411 is a plurality of second order subband signals.

Plurality of output subband signals 411 includes $K^2$ signals. In particular, plurality of output subband signals 411 includes K subsets of K signals each.

Set of time shifters 402 includes K−1 time shifters. In this manner, set of time shifters 402 is used to form K−1 time-shifted versions of input signal 412. Together, input signal 412 and the K−1 time-shifted versions of input signal 412 form a total of K signals.

As depicted, set of time shifters 402 includes first time shifter 415, second time shifter 417, and some number of time shifters up to K−1 time shifter 419. First time shifter 415 delays input signal 412 a first time by the selected time delay, 2π/K, to form delayed signal 416. Second time shifter 417 delays input signal 412 further by the selected time delay to form time-shifted signal 418. In this manner, K−1 time shifter 419 may delay any signal received by the selected time delay to form time-shifted signal 420.

Input signal 412 and the K−1 time-shifted versions of input signal 412 are sent into set of downsamplers 404 to form plurality of downsampled signals 421. In this illustrative example, each of set of downsamplers 404 is configured to downsample by a selected downsampling rate, M. This selected downsampling rate, M, may be set as equal to the number of subbands desired, which is K in this illustrative example. Consequently, M equals K.

Plurality of downsampled signals 421 are sent through set of delay units 406 to form plurality of delayed signals 422. The time delay applied by each of set of delay units 406 may be selected such that plurality of downsampled signals 421 reach set of second layer analysis filters 408 substantially simultaneously.

As depicted, plurality of delayed signals 422 include delayed signal 423, delayed signal 424, delayed signal 425, and delayed signal 426. Set of second layer analysis filters 408 include analysis filter 430, analysis filter 432, analysis filter 434, and analysis filter 436.

Each of analysis filter 430, analysis filter 432, analysis filter 434, and analysis filter 436 is used to implement a sub-layer of filtering in a second filter-modulation layer for second order analysis filter bank 400. In particular, these filters may perform filtering of the output of a first filter-modulation layer for second order analysis filter bank 400. In this manner, second order analysis filter bank 400 has two filter-modulation layers. An example of a manner in which each of set of second layer analysis filters 408 may be implemented is depicted in FIG. 5 below.

In response to receiving delayed signal 423, analysis filter 430 outputs filtered set of subband signals 440. Each one of filtered set of subband signals 440 may correspond to a different one of set of second layer modulators 410. In other words, as depicted, each of filtered set of subband signals 440 may be sent as input into a corresponding one of set of second layer modulators 410. In particular, each subband signal in filtered set of subband signals 440, which may correspond to a particular $k_1$ subband, may be sent into the modulator in set of second layer modulators 410 having a modulation index equal to the index of the particular $k_1$ subband.

Similarly, analysis filter 432 produces filtered set of subband signals 442 in response to receiving delayed signal 424. Each subband signal in filtered set of subband signals 442, which may correspond to a particular $k_1$ subband, may be sent into the modulator in set of second layer modulators 410 having a modulation index equal to the index of the particular $k_1$ subband.

Analysis filter 434 produces filtered set of subband signals 444 in response to receiving delayed signal 425. Each subband signal in filtered set of subband signals 444, which may correspond to a particular $k_1$ subband, may be sent into the modulator in set of second layer modulators 410 having a modulation index equal to the index of the particular $k_1$ subband.

Analysis filter 436 produces filtered set of subband signals 446 in response to receiving delayed signal 426. Each subband signal in filtered set of subband signals 444, which may correspond to a particular $k_1$ subband, may be sent into the modulator in set of second layer modulators 410 having a modulation index equal to the index of the particular $k_1$ subband. In this manner, each modulator in set of second layer modulators 410 may receive a subband signal from each one of set of second layer analysis filters 408.

As depicted, set of second layer modulators 410 includes modulator 448, modulator 450, modulator 452, and modulator 454. Modulator 448, modulator 450, modulator 452, and modulator 454 output set of output subband signals 456, set of output subband signals 458, set of output subband signals 460, and set of output subband signals 462, respectively. Set of output subband signals 456, set of output subband signals 458, set of output subband signals 460, and set of output subband signals 462 together form plurality of output subband signals 411.

With reference now to FIG. 5, an illustration of a functional block diagram of a second layer analysis filter is depicted in accordance with an illustrative embodiment. In this illustrative example, second layer analysis filter 500 may be an example of one manner in which each of set of second layer analysis filters 408 in FIG. 4 may be implemented.

In this illustrative example, second layer analysis filter 500 includes set of first layer modules 502 and set of time shifters 504. An example of one manner in which each of set of first layer modules 502 may be implemented is described in FIG. 6 below. Each of set of first layer modules 502 performs a first filter-modulation layer of processing.

Each of set of first layer modules 502 receives input signal 412 from FIG. 4 as an input. As depicted, set of first layer modules 502 includes first layer module 506, first layer module 508, first layer module 510, and first layer module 512. First layer module 506, first layer module 508, first layer module 510, and first layer module 512 output set of subband signals 514, set of subband signals 516, set of subband signals 518, and set of subband signals 520, respectively. Each subband signal in set of subband signals 514 is multiplied by input signal 501. Each subband signal in set of subband signals 516, set of subband signals 518, and set of subband signals 520 is multiplied by a corresponding delayed version of input signal 501.

In this illustrative example, input signal 501 may be a corresponding one of plurality of delayed signals 422 in FIG. 4. For example, when second layer analysis filter 500 is used to implement analysis filter 430 in FIG. 4, input signal 501 may be delayed signal 423.

Set of time shifters 504 includes first time shifter 522, second time shifter 524, and some number of time shifters up to K−1 time shifter 526. First time shifter 522 delays input signal 501 a first time by the selected time delay, $2\pi/K$, to form delayed signal 528. Second time shifter 524 delays delayed signal 528 further by the selected time delay to form time-shifted signal 530. In this manner, K−1 time shifter 526 may delay any signal received by the selected time delay to form time-shifted signal 532.

Each of set of subband signals 514 may be multiplied by input signal 501 to form set of modified subband signals 534. Each of set of subband signals 516 may be multiplied by delayed signal 528 to form set of modified subband signals 536. Similarly, each of set of subband signals 518 may be multiplied by time-shifted signal 530 to form set of modified subband signals 538. Further, each of set of subband signals 520 may be multiplied by time-shifted signal 532 to form set of modified subband signals 540.

One corresponding subband signal from each of these sets of subband signals may be combined together to form filtered set of subband signals 542. For example, each subband signal corresponding to a $k_i$ subband in the different sets of subband signals produced by set of first layer modules 502 are summed to form a filtered subband signal for the $k_i$ subband.

A filtered subband signal may be formed for each of the K subbands in a similar manner to form the full filtered set of subband signals 542. The formation of filtered set of subband signals 542 in FIG. 5 may be an example of one manner in which each of filtered set of subband signals 440, filtered set of subband signals 442, filtered set of subband signals 444, and filtered set of subband signals 446 in FIG. 4 may be formed.

With reference now to FIG. 6, an illustration of a functional block diagram of a first layer module is depicted in accordance with an illustrative embodiment. In this illustrative example, first layer module 600 is an example of one manner in which each of set of first layer modules 502 in FIG. 5 may be implemented. As depicted, first layer module 600 may be implemented in a manner similar to first order analysis filter bank 300 in FIG. 3.

First layer module 600 includes set of time shifters 602, set of downsamplers 604, set of first layer analysis filters 606, and first layer modulator 608. In response to receiving input signal 412 from FIG. 4, first layer module 600 outputs set of subband signals 610. The formation of set of subband signals 610 in FIG. 6 may be an example of one manner in which each of set of subband signals 514, set of subband signals 516, set of subband signals 518, and set of subband signals 520 in FIG. 5 may be formed.

Second order analysis filter bank 400 as described in FIGS. 4-6 may be expressed as follows:

$$H_2^{m_1,m_2}(z_1, z_2) = \sum_{k_1=0}^{N_1-1} z_1^{-k_1} W_K^{-m_1 k_1} \quad (17)$$

$$\sum_{n_1=0}^{N_1-1} z_1^{-n_1 K} \sum_{k_2=0}^{N_2-1} z_2^{-k_2} W_K^{-m_2 k_2} \sum_{n_2=0}^{N_2-1} h_2[n_1 K + k_1, n_2 K + k_2] z_2^{-n_2 K}$$

where $H_2^{m_1,m_2}(z_1, z_2)$ is the Z-transform of second order analysis filter bank 400 that includes two filter-modulation layers; $m_1$ is the first layer modulation index; $m_2$ is the second layer modulation index; $z_1^{-k_1}$ represents the delayed and downsampled version of the input signal for the second filter-modulation layer; and $z_2^{-k_2}$ represents the delayed and downsampled version of the input signal for the first filter-modulation layer.

First layer module 600 performs a first filter-modulation layer of processing, which includes a sub-layer of filtering and a sub-layer of modulation. This first filter-modulation layer may be implemented in a manner similar to first order analysis filter bank 300 in FIG. 3. The sub-layer of filtering for this first filter-modulation layer is expressed as follows:

$$F_2^{l_1,k_2}(z_2^K) = \sum_{n_2=0}^{N_2-1} h_2[l_1, n_2 K + k_2] z_2^{-n_2 K} \quad (18)$$

with the sub-layer of modulation in the first filter-modulation layer expressed as follows:

$$H_2^{m_2}(l_1, z_2) = \sum_{k_2=0}^{K-1} z_2^{-k_2} W_K^{-m_2 k_2} F_2^{l_1,k_2}(z_2^K) \quad (19)$$

where $k_2 = 0, 1, 2, \ldots, K-1$,
where $n_2 = 0, 1, 2, \ldots, N_2-1$,
where $F_2^{l_2,k_2}(z_2^K)$ is the impulse response of a first layer analysis filter in set of first layer analysis filters 606 in FIG. 6 corresponding to a particular subband, $k_2$, and where $W_K^{-m_2 k_2}$ is the discrete Fourier transformation used to implement the sub-layer of modulation performed by first layer modulator 608 in FIG. 6.

The sub-layer of filtering in the second filter-modulation layer of processing is expressed as follows:

$$F_2^{k_1,m_2}(z_1^K, z_2^K) = \sum_{n_1=0}^{N_1-1} H_2^{m_2}(n_1 K + k_1, z_2^K) z_1^{-n_1 K} \quad (20)$$

with the sub-layer of modulation in the first filter-modulation layer expressed as follows:

$$H_2^{m_1,m_2}(z_1, z_2) = \sum_{k_1=0}^{K-1} z_1^{-k_1} W_K^{-m_1 k_1} F_2^{k_1,m_2}(z_1^K, z_2^K). \quad (21)$$

In other illustrative examples, equations (17)-(21) may be expressed in matrix form.

With reference now to FIGS. 7-11, illustrations of functional block diagrams for a third order analysis filter bank are depicted in accordance with an illustrative embodiment. In FIGS. 7A and 7B, the third filter-modulation layer of processing performed by third order analysis filter bank 700 is described and depicted. The second filter-modulation layer of processing performed by third order analysis filter bank 700 is described in FIG. 9. The first filter-modulation layer of processing performed by third order analysis filter bank 700 is described in FIG. 11.

Figure 7A:
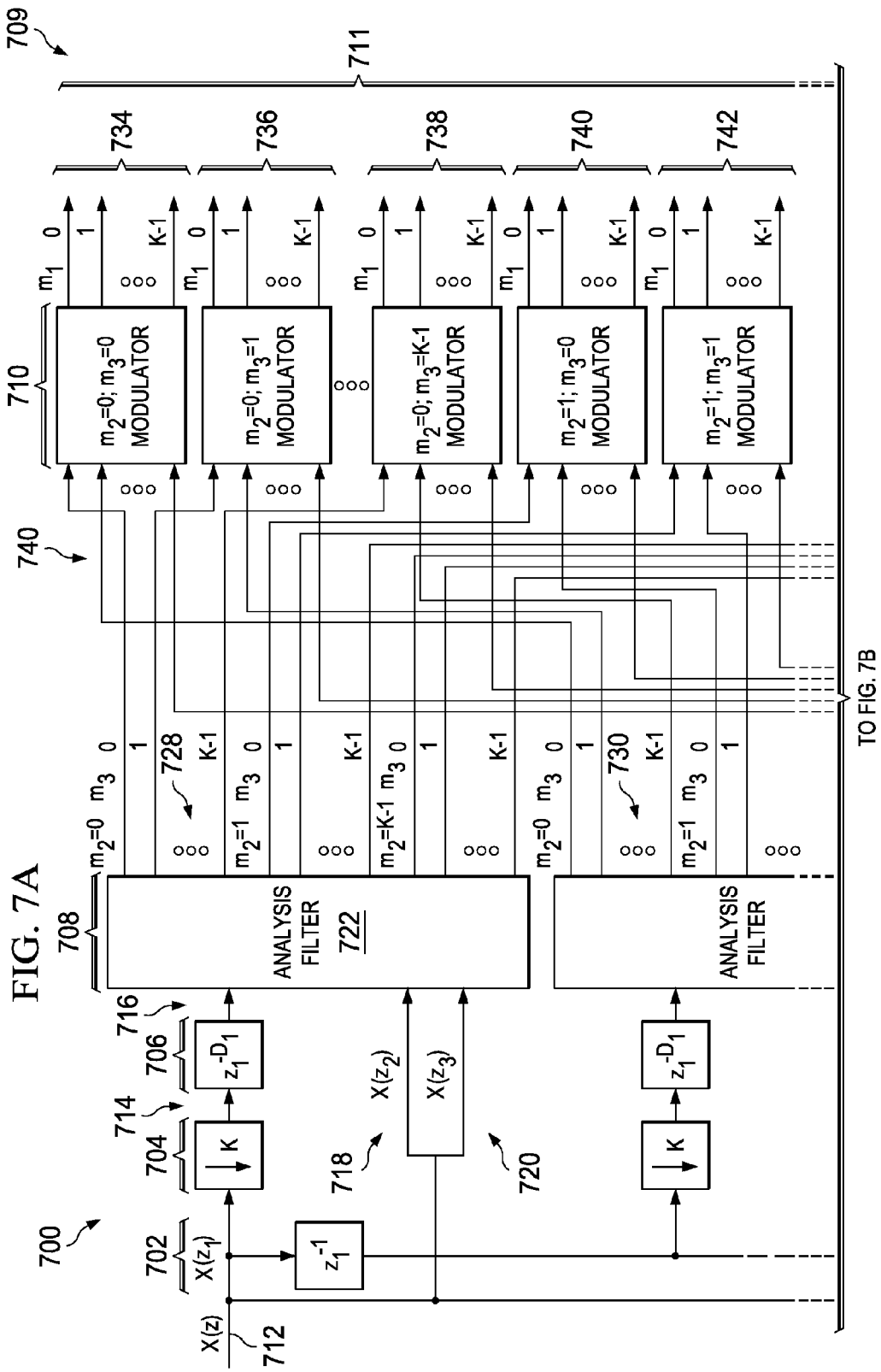
FIGS. 7A and 7B are illustrations of a functional block diagram of a third order analysis filter bank in accordance with an illustrative embodiment.
Figure 7B:
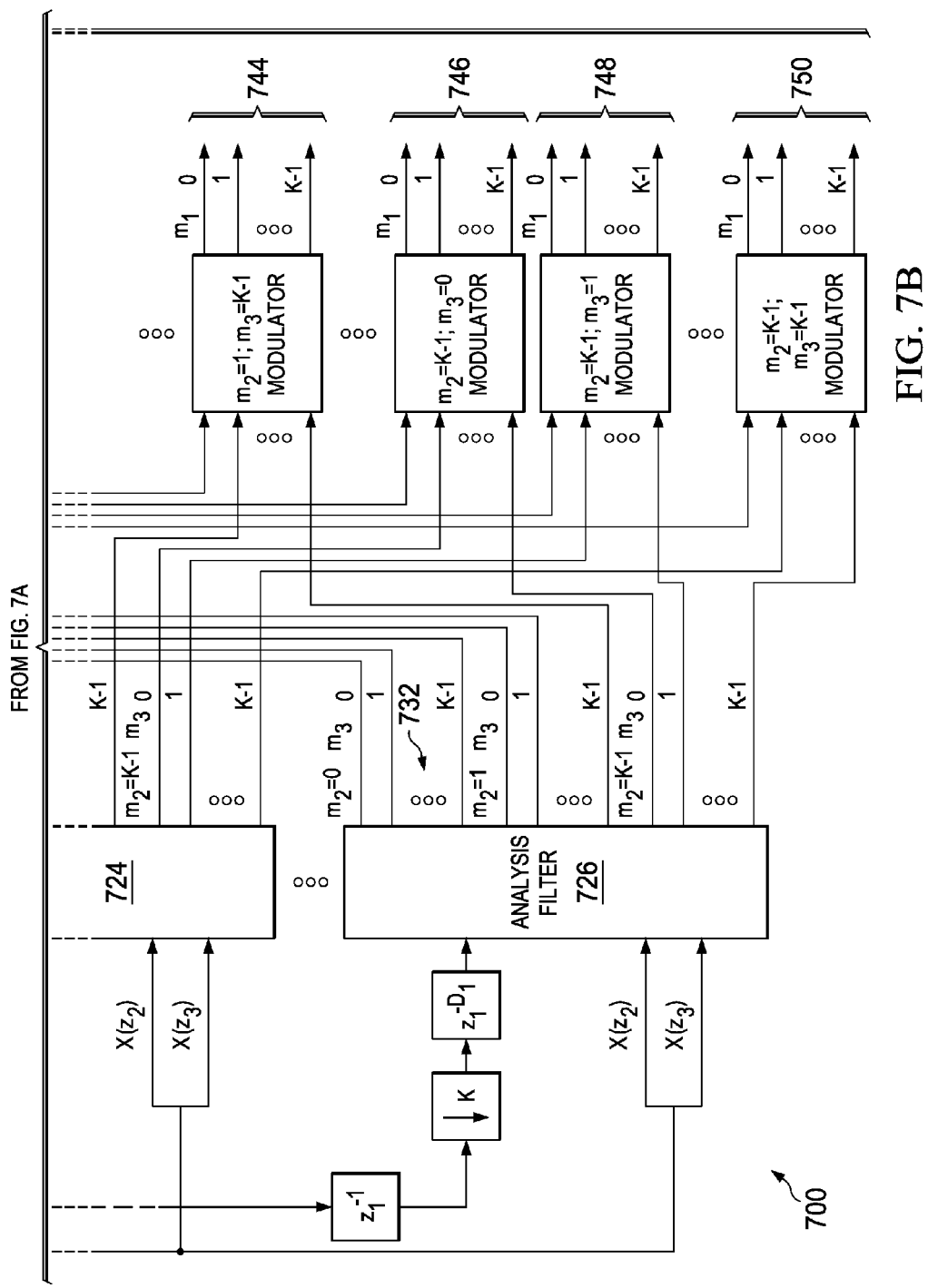

Turning now to FIGS. 7A and 7B, an illustration of a functional block diagram of a third order analysis filter bank is depicted in accordance with an illustrative embodiment. In this illustrative example, third order analysis filter bank 700 is an example of one implementation for third order analysis filter bank 212 in FIG. 2. Third order analysis filter bank 700 is a polyphase filter bank.

As depicted, third order analysis filter bank 700 includes set of time shifters 702, set of downsamplers 704, set of delay units 706, set of third layer analysis filters 708, and set of third layer modulators 710. Third order analysis filter bank 700 generates third order nonlinear component 709 in response to receiving input signal 712. Third order nonlinear component 709 comprises plurality of output subband signals 711.

Plurality of output subband signals 711 includes $K^3$ signals. Plurality of output subband signals 711 is the output of a third filter-modulation layer of processing of third order analysis filter bank 700.

Set of time shifters 702 includes the K−1 time shifters. In this manner, set of time shifters 702 is used to form K−1 time-shifted versions of input signal 712. Together, input signal 712 and the K−1 time-shifted versions of input signal 712 form a total of K signals.

Input signal 712 and the K−1 time-shifted versions of input signal 712 are sent into set of downsamplers 704 to form plurality of downsampled signals 714. In this illustrative example, each of set of downsamplers 704 is configured to be downsampled by a selected downsampling rate, M. This selected downsampling rate, M, may be set as equal to the number of subbands desired, which is K in this illustrative example. Consequently, M equals K.

Plurality of downsampled signals 714 are sent through set of delay units 706 to form plurality of delayed signals 716. The time delay applied by each of set of delay units 706 may be selected such that plurality of downsampled signals 714 reach set of third layer analysis filters 708 substantially simultaneously. As depicted, set of third layer analysis filters 708 include third layer analysis filter 722, third layer analysis filter 724, and third layer analysis filter 726.

Each of third layer analysis filter 722, third layer analysis filter 724, and third layer analysis filter 726 is used to implement a sub-layer of filtering in a third filter-modulation layer for third order analysis filter bank 700. In particular, each of these third layer analysis filters may perform filtering of the output of a second filter-modulation layer for third order analysis filter bank 700. In this manner, third order analysis filter bank 700 has three filter-modulation layers.

As depicted, each of third layer analysis filter 722, third layer analysis filter 724, and third layer analysis filter 726 may receive a corresponding one of plurality of downsampled signals 714 as well as version 718 and version 720 of input signal 712. An example of a manner in which each of set of third layer analysis filters 708 may be implemented is depicted in FIGS. 8-9 below.

As depicted, third layer analysis filter 722 outputs filtered set of subband signals 728; third layer analysis filter 724 outputs filtered set of subband signals 730; and third layer analysis filter 726 outputs filtered set of subband signals 732. These filtered sets of subband signals are sent into set of third layer modulators 710 for modulation. In particular, each subband signal in a filtered set of subband signals is sent into a corresponding modulator in set of third layer modulators 710.

Set of third layer modulators 710 outputs plurality of output subband signals 711. Plurality of output subband signals 711 includes set of subband signals 734, set of subband signals 736, set of subband signals 738, set of subband signals 740, set of subband signals 742, set of subband signals 744, set of subband signals 746, set of subband signals 748, and set of subband signals 750.

Figure 8A:
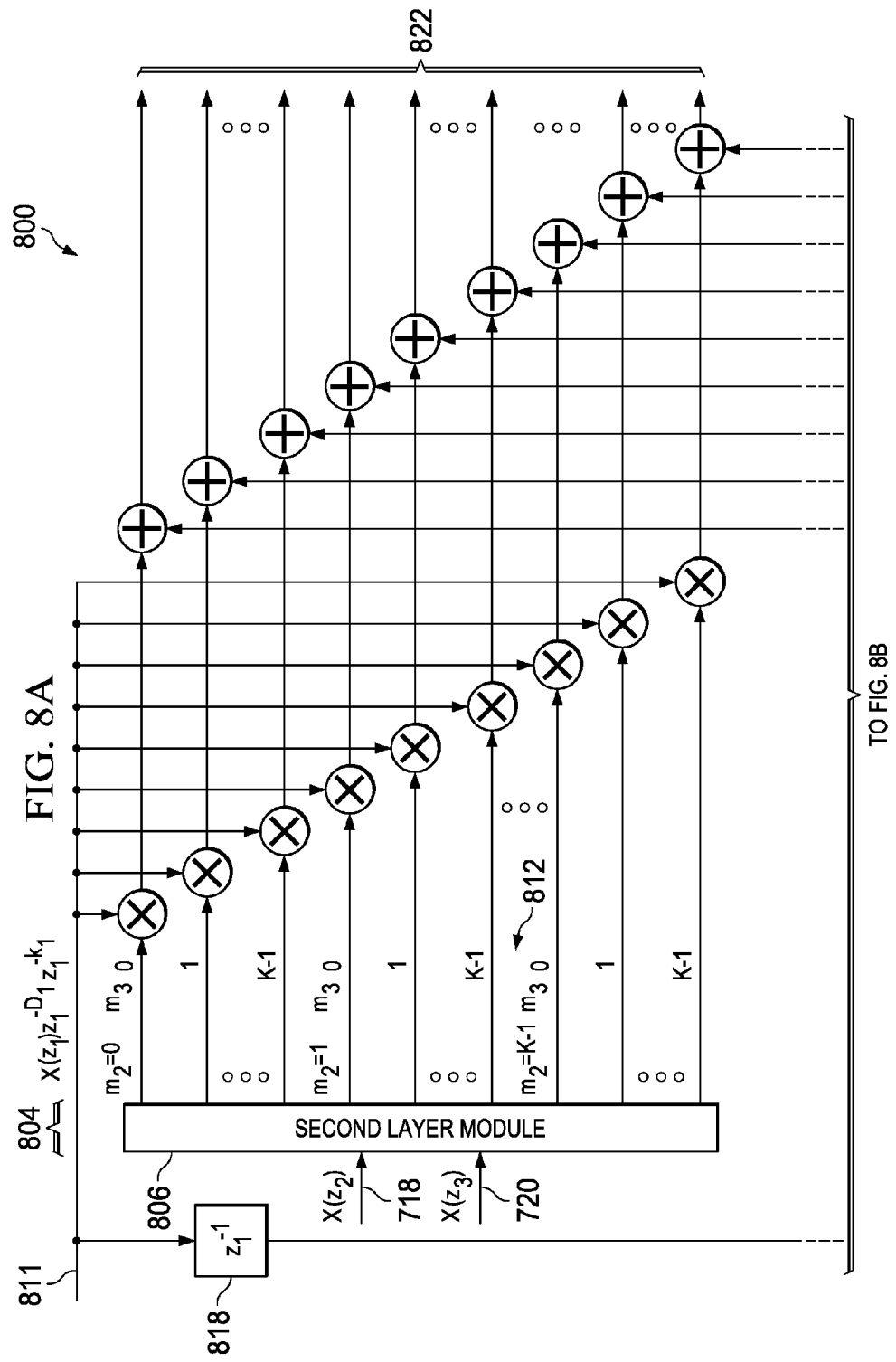
Figure 8C:
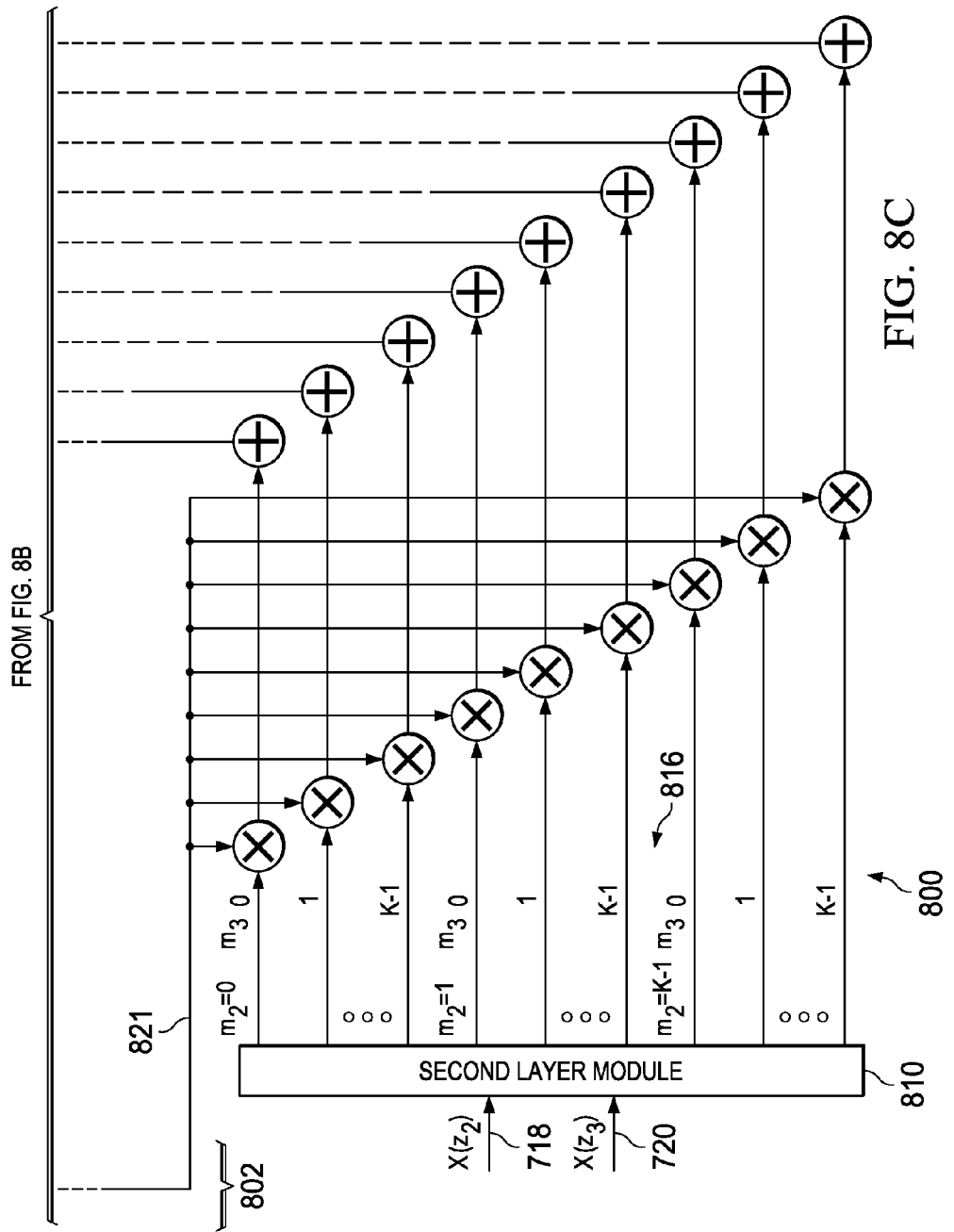
Figure 9:
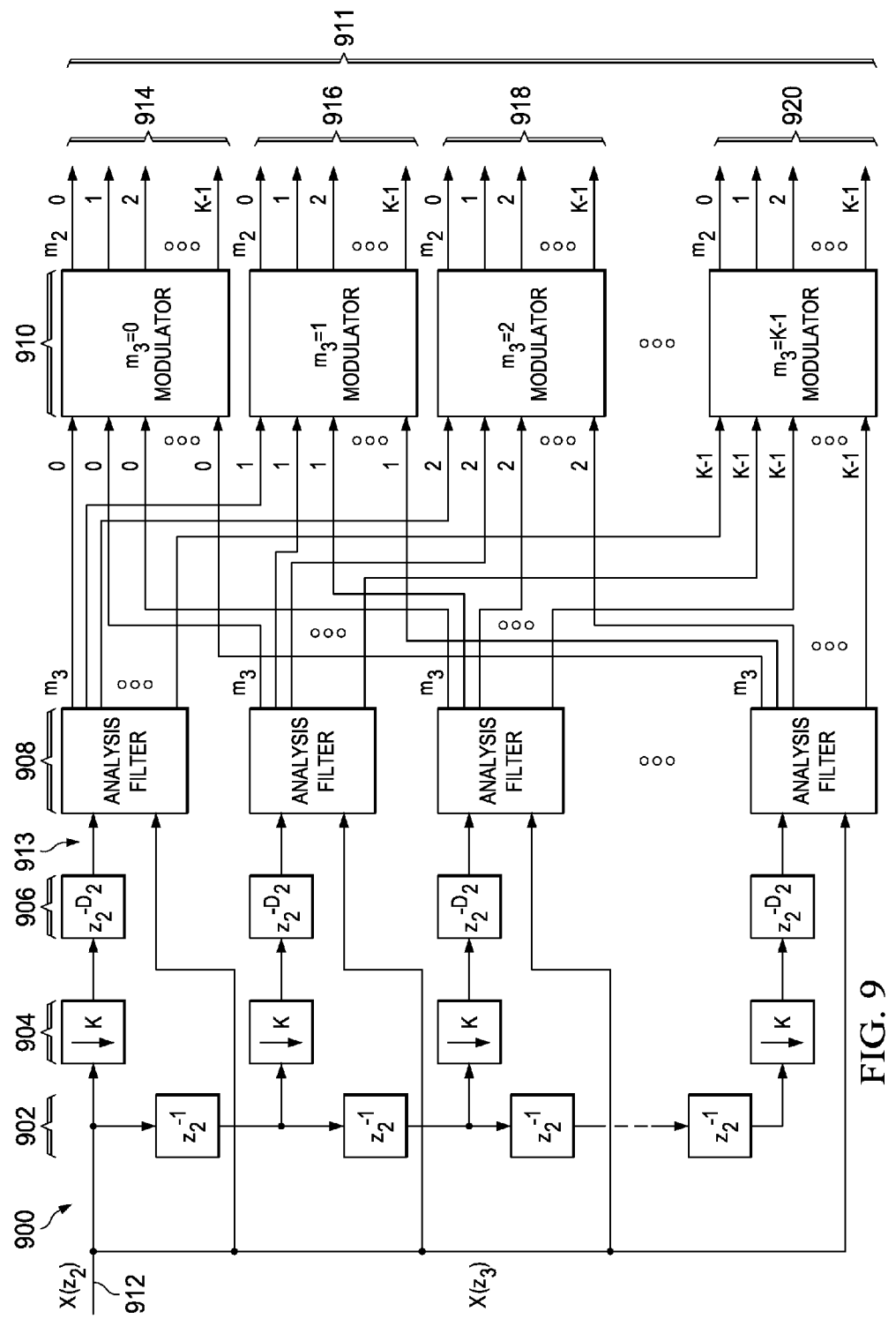
FIG. 9 is an illustration of a functional block diagram of a second layer module in accordance with an illustrative embodiment.

With reference now to FIGS. 8A, 8B, and 8C, an illustration of a functional block diagram of a third layer analysis filter is depicted in accordance with an illustrative embodiment. In this illustrative example, third layer analysis filter 800 may be an example of one manner in which each of set of third layer analysis filters 708 in FIGS. 7A and 7B may be implemented.

In this illustrative example, third layer analysis filter 800 includes set of time shifters 802 and set of second layer modules 804. An example of one manner in which each of set of second layer modules 804 may be implemented is described in FIG. 9 below. Each of set of second layer modules 804 performs a second filter-modulation layer of processing.

Each of set of second layer modules 804 receives version 718 of input signal 712 and version 720 of input signal 712 from FIG. 7A as inputs. Version 720 and version 718 may be the same as input signal 712 in these illustrative examples. As depicted, set of second layer modules 804 includes second layer module 806, second layer module 808, and second layer module 810. Second layer module 806, second layer module 808, and second layer module 810 output set of subband signals 812, set of subband signals 814, and set of subband signals 816, respectively.

In this illustrative example, input signal 811 may be a corresponding one of plurality of delayed signals 716 in FIG. 7A. Set of time shifters 802 includes first time shifter 818, and some number of time shifters up to K−1 time shifter 820.

First time shifter 818 delays input signal 811 a first time by the selected time delay, $2\pi/K$, to form delayed signal 819. Further, K−1 time shifter 820 may delay any signal received by the selected time delay to form time-shifted signal 821. Each of set of subband signals 812 may be multiplied by input signal 811, each of set of subband signals 814 may be multiplied by delayed signal 819, and each of set of subband signals 816 may be multiplied by time-shifted signal 821 to form modified subband signals that may be then combined to form filtered set of subband signals 822. The formation of filtered set of subband signals 822 in FIG. 8A may be an example of one manner in which each of filtered set of subband signals 728, filtered set of subband signals 730, and filtered set of subband signals 732 in FIGS. 7A and 7B may be formed.

With reference now to FIG. 9, an illustration of a functional block diagram of a second layer module is depicted in accordance with an illustrative embodiment. In this illustrative example, second layer module 900 is an example of one manner in which each of set of second layer modules 804 in FIGS. 8A, 8B, and 8C may be implemented. As depicted, second layer module 900 may be implemented in a manner similar to second order analysis filter bank 400 in FIG. 4.

Second layer module 900 includes set of time shifters 902, set of downsamplers 904, set of delay units 906, set of second layer analysis filters 908, and set of modulators 910. In response to receiving input signal 912, second layer module 900 outputs set of second layer subband signals 911.

Set of second layer subband signals 911 may be the output of the second filter-modulation layer of third order analysis filter bank 700 in FIGS. 7A and 7B. The formation of set of second layer subband signals 911 in FIG. 9 may be an example of the manner in which each of set of subband signals 812, set of subband signals 814, and set of subband signals 816 in FIGS. 8A, 8B, and 8C are formed.

In particular, input signal 912 may be processed to form plurality of delayed signals 913 using set of time shifters 902, set of downsamplers 904, and set of delay units 906 in a manner similar to the processing of input signal 412 in FIG. 4. Set of delayed signals 913 may be sent as input into set of second layer analysis filters 908. An example of one manner in which each of set of second layer analysis filters 908 may be implemented is described below in FIG. 10.

Set of second layer analysis filters 908 may be used to form filtered sets of subband signals that are then rearranged into new sets of input signals for set of modulators 910. Set of modulators 910 outputs set of second layer subband signals 911. Set of second layer subband signals 911 includes set of subband signals 914, set of subband signals 916, set of subband signals 918, and set of subband signals 920.

Figure 10:
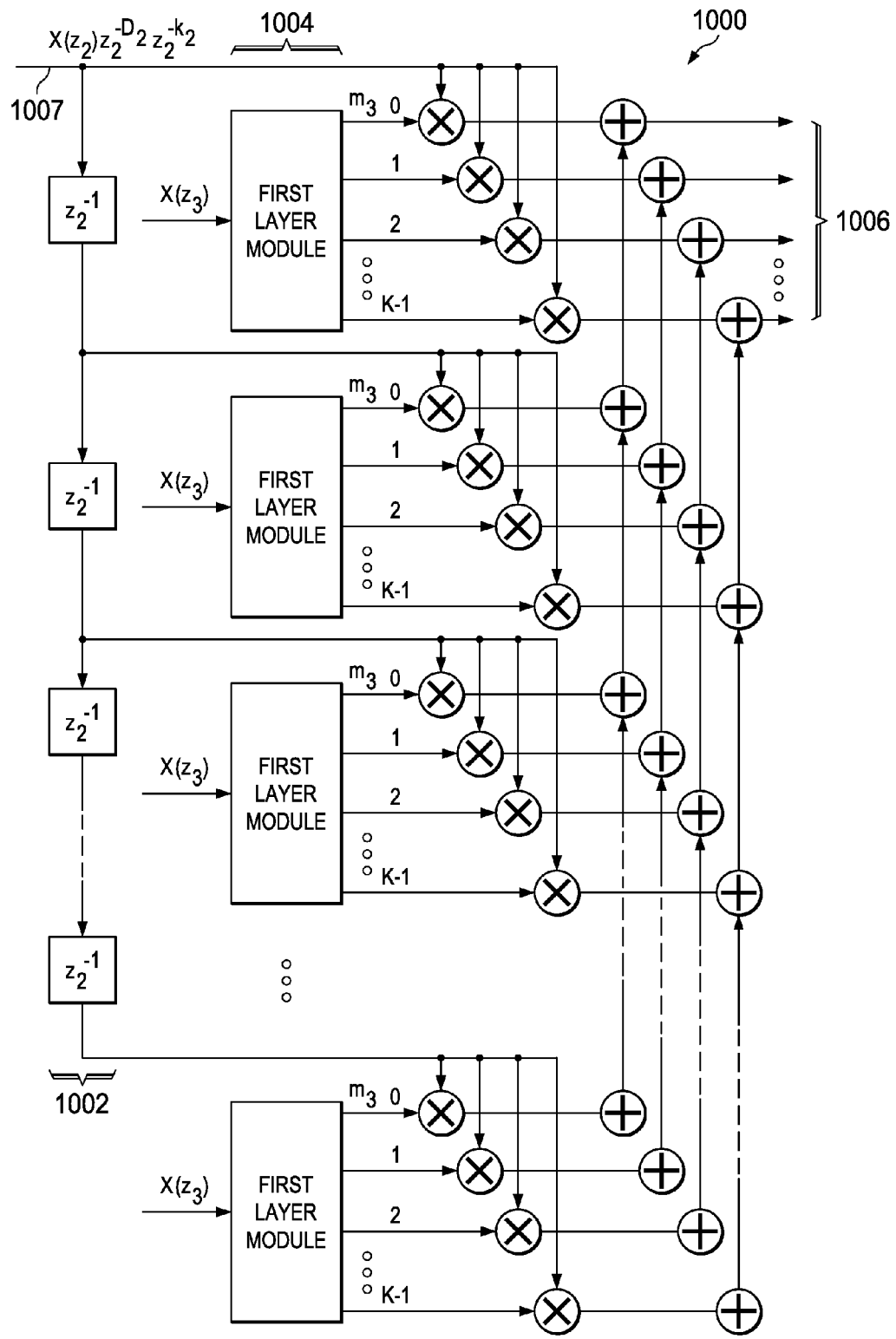
FIG. 10 is an illustration of a functional block diagram of a second layer analysis filter in accordance with an illustrative embodiment.

With reference now to FIG. 10, an illustration of a functional block diagram of a second layer analysis filter is depicted in accordance with an illustrative embodiment. In this illustrative example, second layer analysis filter 1000 may be an example of one manner in which each of set of second layer analysis filters 908 in FIG. 9 may be implemented. Second layer analysis filter 1000 may be implemented in a manner similar to the manner described for second layer analysis filter 500 in FIG. 5.

In this illustrative example, second layer analysis filter 1000 includes set of time shifters 1002 and set of first layer modules 1004. An example of one manner in which each of set of first layer modules 1004 may be implemented is described in FIG. 11 below. Each of set of first layer modules 1004 performs a first filter-modulation layer of processing. Each of set of first layer modules 1004 receives input signal 1007 as an input and outputs set of subband signals 1006. The formation of set of subband signals 1006 in FIG. 10 may be an example of the manner in which a set of subband signals may be formed by one of second layer analysis filters 908.

Figure 11:
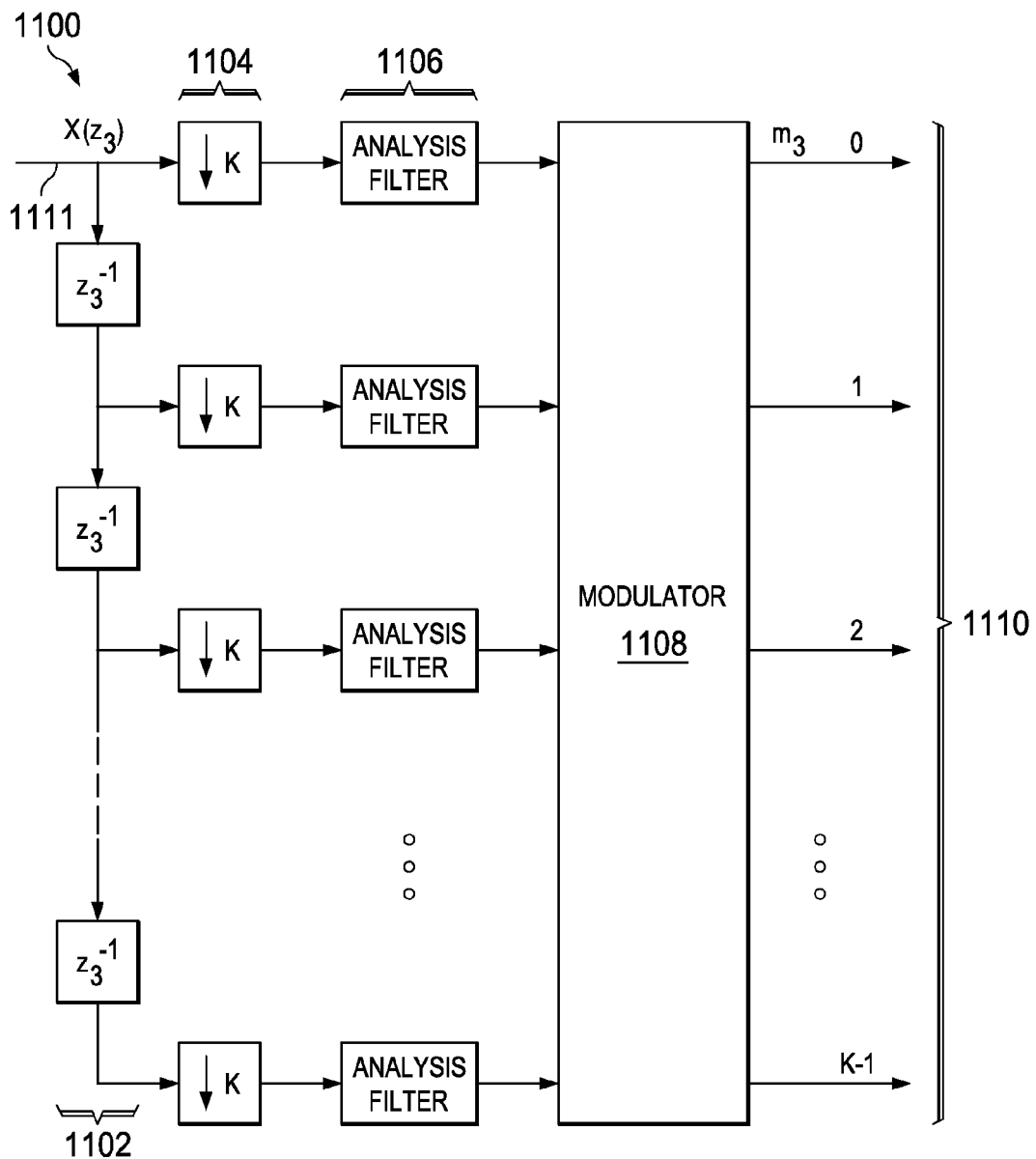
FIG. 11 is an illustration of a functional block diagram of a first layer module in accordance with an illustrative embodiment.

With reference now to FIG. 11, an illustration of a first layer module is depicted in accordance with an illustrative embodiment. In this illustrative example, first layer module 1100 is an example of one manner in which each of set of first layer modules 1004 in FIG. 10 may be implemented. As depicted, first layer module 1100 may be implemented in a manner similar to first layer module 600 in FIG. 6. Further, first layer module 1100 may be implemented in a manner similar to first order analysis filter bank 300 in FIG. 3.

First layer module 1100 includes set of time shifters 1102, set of downsamplers 1104, set of first layer analysis filters 1106, and first layer modulator 1108. In response to receiving input signal 1111, first layer module 1100 outputs set of subband signals 1110.

Third order analysis filter bank 700 as described in FIGS. 7-11 may be expressed as follows:

$$H_3^{m_1,m_2,m_3}(z_1, z_2, z_3) = \sum_{k_1=0}^{K-1} z_1^{-k_1} W_K^{-m_1 k_1} \sum_{k_2=0}^{K-1} z_2^{-k_2} W_K^{-m_2 k_2} \sum_{k_3=0}^{K-1} z_3^{-k_3} W_K^{-m_3 k_3} \sum_{n_1=0}^{N_1-1} \sum_{n_2=0}^{N_2-1} \sum_{n_3=0}^{N_3-1} h_3 \quad (22)$$

$$[n_1 K + k_1, n_2 K + k_2, n_3 K + k_3] z_1^{-n_1 K} z_2^{-n_2 K} z_3^{-n_3 K}$$

where $H_3^{m_1,m_2,m_3}(z_1, z_2, z_3)$ is the Z-transform of the third order filter that includes three filter-modulation layers; $m_1$ is the first layer modulation index; $m_2$ is the second layer modulation index; $m_3$ is the second layer modulation index; $z_1^{-k_1}$ is the delayed and downsampled version of the input signal for the second filter-modulation layer; $z_2^{-k_2}$ is the delayed and downsampled version of the input signal for the second filter-modulation layer; and $z_3^{-k_3}$ is the delayed and downsampled version of the input signal for the second filter-modulation layer.

First layer module 1100 performs a first filter-modulation layer of processing, which includes a sub-layer of filtering and a sub-layer of modulation. This first filter-modulation layer may be implemented in a manner similar to first order analysis filter bank 300 in FIG. 3. The sub-layer of filtering for this first filter-modulation layer is expressed as follows:

$$F_3^{l_1,l_2,k_3}(z_3^K) = \sum_{n_3=0}^{N_3-1} h_3[l_1, l_2, n_3K+k_3]z_3^{-n_3K} \quad (23)$$

with the sub-layer of modulation in the first filter-modulation layer expressed as follows:

$$H_3^{m_3}(l_1, l_2, z_3) = \sum_{k_3=0}^{K-1} z_3^{-k_3} W_K^{-m_3k_3} F_3^{l_1,l_2,k_3}(z_3^K). \quad (24)$$

The sub-layer of filtering in the second filter-modulation layer of processing is expressed as follows:

$$F_3^{l_1,k_2,m_3}(z_2^K, z_3^K) = \sum_{n_2=0}^{N_2-1} H_3^{m_3}(l_1, n_2K+k_2, z_3)z_2^{-n_2K} \quad (25)$$

with the sub-layer of modulation in the second filter-modulation layer expressed as follows:

$$H_3^{m_2,m_3}(l_1, z_2, z_3) = \sum_{k_2=0}^{K-1} z_2^{-k_2} W_K^{-m_2k_2} F_3^{l_1,k_2,m_3}(z_2^K, z_3^K). \quad (26)$$

The sub-layer of filtering in the third filter-modulation layer of processing is expressed as follows:

$$F_3^{k_1,m_2,m_3}(z_1^K, z_2^K, z_3^K) = \sum_{n_1=0}^{N_1-1} H_3^{m_2,m_3}(n_1K+k_1, z_2, z_3)z_1^{-n_1K} \quad (27)$$

with the sub-layer of modulation in the second filter-modulation layer expressed as follows:

$$H_3^{m_1,m_2,m_3}(z_1, z_2, z_3) = \sum_{k_1=0}^{K-1} z_1^{-k_1} W_K^{-m_1k_1} F_3^{k_1,m_2,m_3}(z_1^K, z_2^K, z_3^K). \quad (28)$$

Thus, in this manner, first order analysis filter bank 208 from FIG. 2 may be expressed as follows:

$$H_1(z_1) = \sum_{k_1=0}^{K-1} z_1^{-k_1} F_1^{k_1}(z_1^K) \quad (29)$$

where $H_1(z_1)$ is the Z-transform of first order analysis filter bank 208 and where $$F_1^{k_1}(z_1) = \sum_{n_1=0}^{N_1-1} h_1[n_1K+k_1]z_1^{-n_1}. \quad (30)$$

Second order analysis filter bank 210 may be expressed as follows:

$$H_2(z_1, z_2) = \sum_{k_1=0}^{K-1} z_1^{-k_1} \sum_{k_2=0}^{K-1} z_2^{-k_2} F_2^{k_1,k_2}(z_1^K, z_2^K) \quad (31)$$

where $H_2(z_1, z_2)$ is the Z-transform of second order analysis filter bank 210 and where $$F_2^{k_1,k_2}(z_1, z_2) = \sum_{n_1=0}^{N_1-1} \sum_{n_2=0}^{N_2-1} h_2[n_1K+k_1, n_2K+k_2]z_1^{-n_1}z_2^{-n_2}. \quad (32)$$

Third order analysis filter bank 212 may be expressed as follows:

$$H_3(z_1, z_2, z_3) = \sum_{k_1=0}^{K-1} z_1^{-k_1} \sum_{k_2=0}^{K-1} z_2^{-k_2} \sum_{k_3=0}^{K-1} z_3^{-k_3} F_3^{k_1,k_2,k_3}(z_1^K, z_2^K, z_3^K) \quad (33)$$

where $H_3(z_1, z_2, z_3)$ is the Z-transform of third order analysis filter bank 212 and where $$F_3^{k_1,k_2,k_3}(z_1^K, z_2^K, z_3^K) = \sum_{n_1=0}^{N_1-1} \sum_{n_2=0}^{N_2-1} \sum_{n_3=0}^{N_3-1} h_3[n_1K+k_1, n_2K+k_2, n_3K+k_3]z_1^{-n_1K}z_2^{-n_2K}z_3^{-n_3K}. \quad (34)$$

Further, $j^{th}$ order analysis filter bank 214 in FIG. 2 may be expressed as follows:

$$H_j^{m_1,m_2,\ldots,m_j}(z_1, z_2, \ldots, z_j) = H_j(z_1W_M^{m_1}, z_2W_M^{m_2}, \ldots, z_jW_M^{m_j}) =$$

$$\sum_{k_1=0}^{K-1}(z_1W_M^{m_1})^{-k_1} \sum_{k_2=0}^{K-1}(z_2W_M^{m_2})^{-k_2} \ldots \sum_{k_j=0}^{K-1}(z_jW_M^{m_j})^{-k_j}$$

$$F_3^{k_1,k_2,\ldots,k_j}((z_1W_M^{m_1})^K, (z_2W_M^{m_2})^K, \ldots, (z_jW_M^{m_j})^K)$$

where $H_j^{m_1,m_2,\ldots,m_j}(z_1, z_2, \ldots, z_j)$ is the Z-transform of $j^{th}$ order analysis filter bank 214 and where $$W_M^{m_i} = e^{-j\frac{2\pi}{M}m_i} \; i = 1, 2, \ldots, j. \quad (36)$$

If K is equal to M, $W_M^{m_i}$ is equal to 1 and equation (35) may be simplified as follows:

$$H_j^{m_1,m_2,\ldots,m_j}(z_1, z_2, \ldots, z_j) = \quad (37)$$

$$\sum_{k_1=0}^{K-1} z_1^{-k_1} W_K^{-m_1k_1} \sum_{k_2=0}^{K-1} z_2^{-k_2} W_K^{-m_2k_2} \ldots \sum_{k_j=0}^{K-1} z_j^{-k_j} W_K^{-m_jk_j}$$

$$\sum_{n_1=0}^{N_1-1} \sum_{n_2=0}^{N_2-1} \ldots \sum_{n_j=0}^{N_j-1} h_j[n_1K+k_1, n_2K+k_2, \ldots,$$

$$n_jK+k_j]z_1^{-n_1K}z_2^{-n_2K}\ldots z_j^{-n_jK}$$

The $j^{th}$ order analysis filter bank 214 may be decomposed into j layers of processing. Each layer of processing may include a sub-layer of filtering and a subsequent sub-layer of modulation. In particular, any $i^{th}$ order analysis filter bank in plurality of analysis filter banks 202 in FIG. 2 may be used to form a nonlinear output component in response to receiving an input signal. The nonlinear output component may be an $i^{th}$ order output component comprising a plurality of $i^{th}$ order subband signals for the selected frequency subbands.

In this manner, an $i^{th}$ order analysis filter bank corresponding to an $i^{th}$ order of nonlinearity may decompose an input signal into a plurality of $i^{th}$ order subband signals to form the $i^{th}$ order component of the input signal. The input signal may be decomposed into the plurality of $i^{th}$ order subband signals performing a number of layers of processing to form the plurality of $i^{th}$ order subband signals. Each of the number of layers of processing may include a sub-layer of filtering and a subsequent sub-layer of modulation. The number of layers is equal in number to i.

Figure 12:
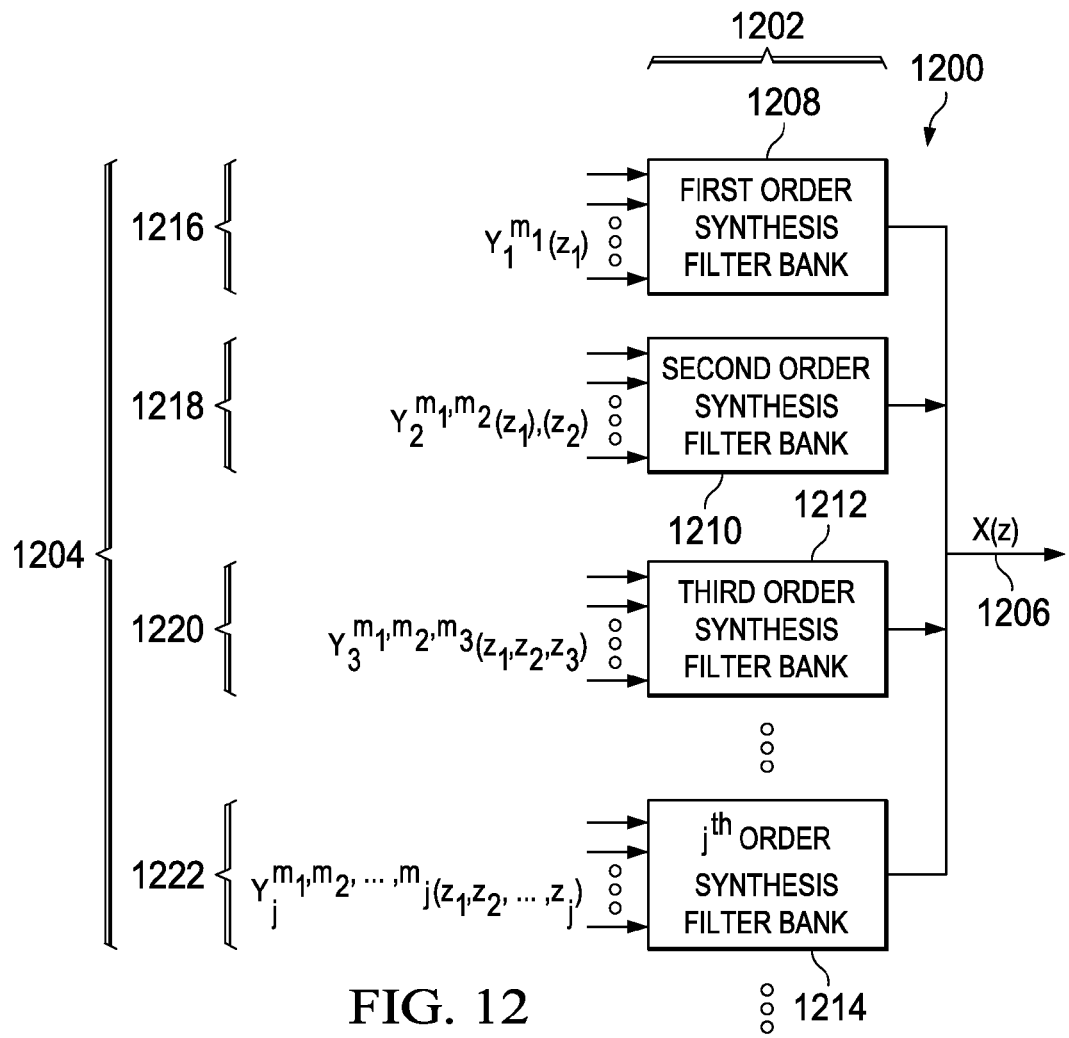
FIG. 12 is an illustration of a functional block diagram of a synthesis filter system in accordance with an illustrative embodiment.

With reference now to FIG. 12, an illustration of a functional block diagram of a synthesis filter system is depicted in accordance with an illustrative embodiment. In this illustrative example, synthesis filter system 1200 is an example of one implementation for synthesis filter system 104 in FIG. 1. Synthesis filter system 1200 may represent the mathematical operations performed by a digital signal processor system, such as digital signal processing system 130 in FIG. 1.

As depicted, synthesis filter system 1200 includes plurality of synthesis filter banks 1202, which may be an example of one implementation for plurality of synthesis filter banks 116 in FIG. 1. Each of plurality of synthesis filter banks 1202 receives plurality of nonlinear input components 1204. Plurality of nonlinear input components 1204 may be an example of one implementation for plurality of nonlinear input components 110 in FIG. 1.

Plurality of synthesis filter banks 1202 includes first order synthesis filter bank 1208, second order synthesis filter bank 1210, third order synthesis filter bank 1212, and some number of other high order synthesis filter banks up to $j^{th}$ order synthesis filter bank 1214. Each of these synthesis filter banks is configured to receive a nonlinear input component corresponding to a particular order of nonlinearity.

Plurality of nonlinear input components 1204 includes first order nonlinear input component 1216, second order nonlinear input component 1218, third order nonlinear input component 1220, and some number of other nonlinear components up to $j^{th}$ order nonlinear input component 1222. In this illustrative example, each of plurality of nonlinear input components 1204 may comprise a corresponding plurality of output subband signals.

First order synthesis filter bank 1208, second order synthesis filter bank 1210, and third order synthesis filter bank 1212 may receive first order nonlinear input component 1216, second order nonlinear input component 1218, and third order nonlinear input component 1220, respectively. Similarly, $j^{th}$ order synthesis filter bank 1214 may receive $j^{th}$ order nonlinear input component 1222. In this manner, any $i^{th}$ order synthesis filter banks in plurality of synthesis filter banks 1202 between third order synthesis filter bank 1212 and $j^{th}$ order synthesis filter bank 1214 may receive a nonlinear input component corresponding to the same $i^{th}$ order of nonlinearity.

Plurality of synthesis filter banks 1202 are used to generate output signal 1206 in response to receiving plurality of nonlinear input components 1204. Each of plurality of synthesis filter banks 1202 produces a signal that is used to form output signal 1206. Output signal 1206 may be an example of one implementation for output signal 112 in FIG. 1. Output signal 1206 formed by synthesis filter system 1200 may be a digital signal that may then be converted into a continuous, real-world, analog signal.

Examples of implementations for analysis filter banks that may be included in plurality of synthesis filter banks 1202 are described in FIGS. 13-20 below. In particular, an example of one implementation for first order synthesis filter bank 1208 in FIG. 12 is described in FIG. 13 below. An example of one implementation for second order synthesis filter bank 1210 is described in FIGS. 14-16 below.

Figure 13:
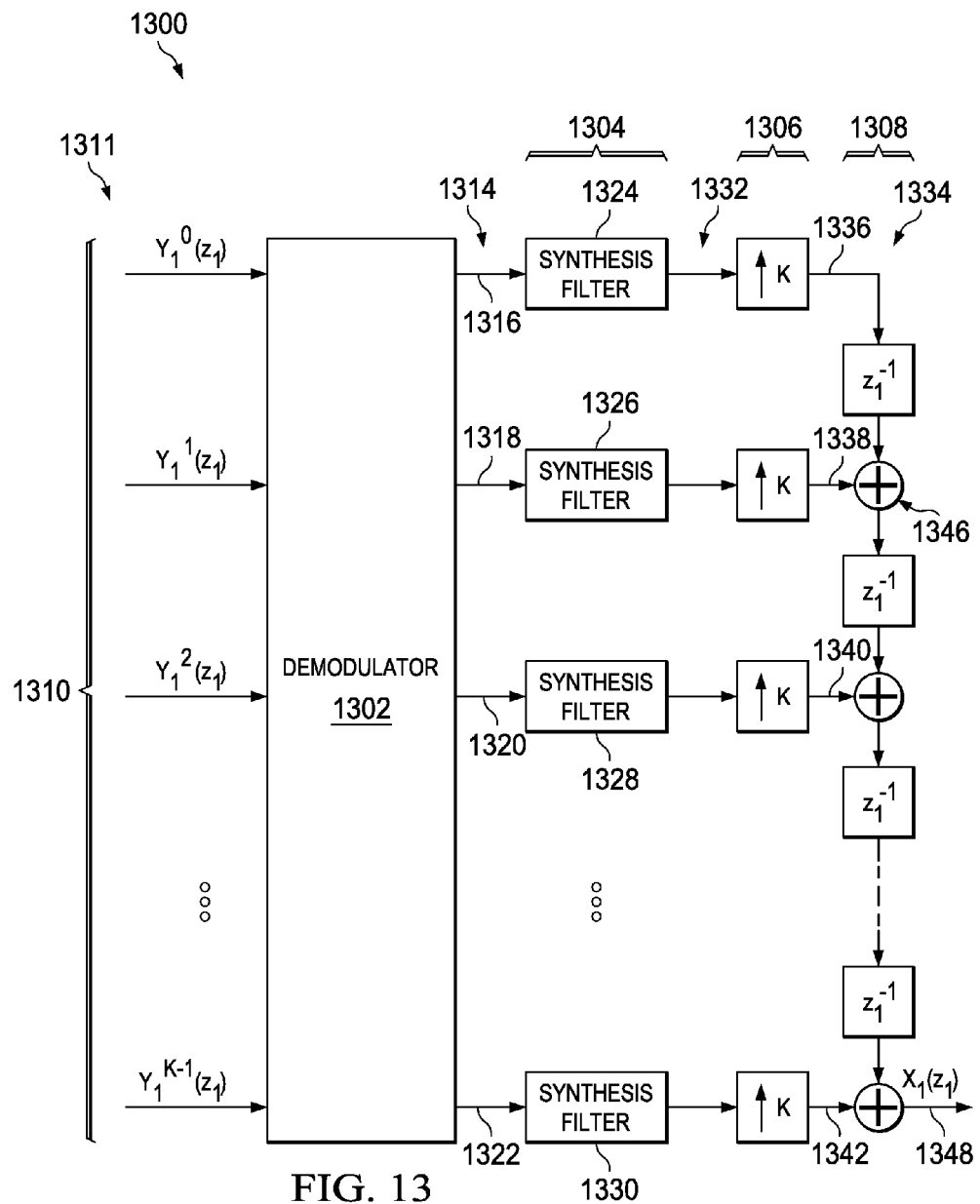
FIG. 13 is an illustration of a functional block diagram of a first order synthesis filter bank in accordance with an illustrative embodiment.

With reference now to FIG. 13, an illustration of a functional block diagram of a first order synthesis filter bank is depicted in accordance with an illustrative embodiment. In this illustrative example, first order synthesis filter bank 1300 is an example of one implementation for first order synthesis filter bank 1208 in FIG. 12. First order synthesis filter bank 1300 is a polyphase filter bank.

As depicted, first order synthesis filter bank 1300 includes demodulator 1302, set of synthesis filters 1304, set of up-samplers 1306, and set of time shifters 1308. Demodulator 1302 may receive first order nonlinear component 1310 as input. First order nonlinear component 1310 may comprise plurality of input subband signals 1311 that includes K subband signals.

Plurality of input subband signals 1311 may be received by demodulator 1302 and demodulated to form plurality of demodulated subband signals 1314. This demodulation is a sub-layer of demodulation in a single layer of processing for first order synthesis filter bank 1300. Plurality of demodulated subband signals 1314 includes demodulated subband signal 1316, demodulated subband signal 1318, demodulated subband signal 1320, and some other number of demodulated subband signals up to K−1 demodulated subband signal 1322.

Plurality of demodulated subband signals 1314 are sent as input into set of synthesis filters 1304. In particular, demodulated subband signal 1316, demodulated subband signal 1318, demodulated subband signal 1320, and K−1 demodulated subband signal 1322 may be sent into synthesis filter 1324, synthesis filter 1326, synthesis filter 1328, and synthesis filter 1330, respectively. Set of synthesis filters 1304 outputs filtered subband signals 1332. The filtering performed by set of synthesis filters 1304 is a sub-layer of filtering in the single layer of processing for first order synthesis filter bank 1300. In this manner, first order analysis filter bank 300 uses a single demodulation-filtering layer of processing. Filtered subband signals 1332 are up-sampled using set of up-samplers 1306 to form set of up-sampled signals 1334. Set of up-sampled signals 1334 are then combined to form first order output component 1348. Set of up-sampled signals 1334 include up-sampled signal 1336, up-sampled signal 1338, up-sampled signal 1340, and up-sampled signal 1342.

First order output component 1348 may be the portion of the final output signal formed by the overall synthesis filter system generated for the first order nonlinear input component. For example, first order output component 1348 may be an example of the first order output component that would be formed by first order synthesis filter bank 1208 in FIG. 12 and used to form the final output signal 1206.

The Z-transform of first order synthesis filter bank 1300 is represented as follows:

$$G_1^{m_1}(z_1) = \Sigma_{p_1=K-1}^{0} W_K^{-m_1 p_1} S_1^{p_1}(z_1^K) z_1^{-p_1} \quad (38)$$

where $G_1^{m_1}(z_1)$ is the Z-transform of first order synthesis filter bank 1300, K is the total number of subbands, $p_i$ is the index of the particular subband corresponding to the particular synthesis filter, $W_K^{-m_1 p_1}$ represents the discrete Fourier transformation, $S_1^{p_1}(z_1^K)$ represents the impulse response of a synthesis filter in set of synthesis filters 1304, and $z_1^{-p_1}$ is the delayed and up-sampled output signal for the first order.

In this manner, first order synthesis filter bank 1300 may function in a manner that appears to be or is similar to a reverse implementation of first order analysis filter bank 300 in FIG. 3. While the output of first order analysis filter bank 300 is first order nonlinear component 307, the input of first order synthesis filter bank 1300 is first order nonlinear component 1310.

Figure 14:
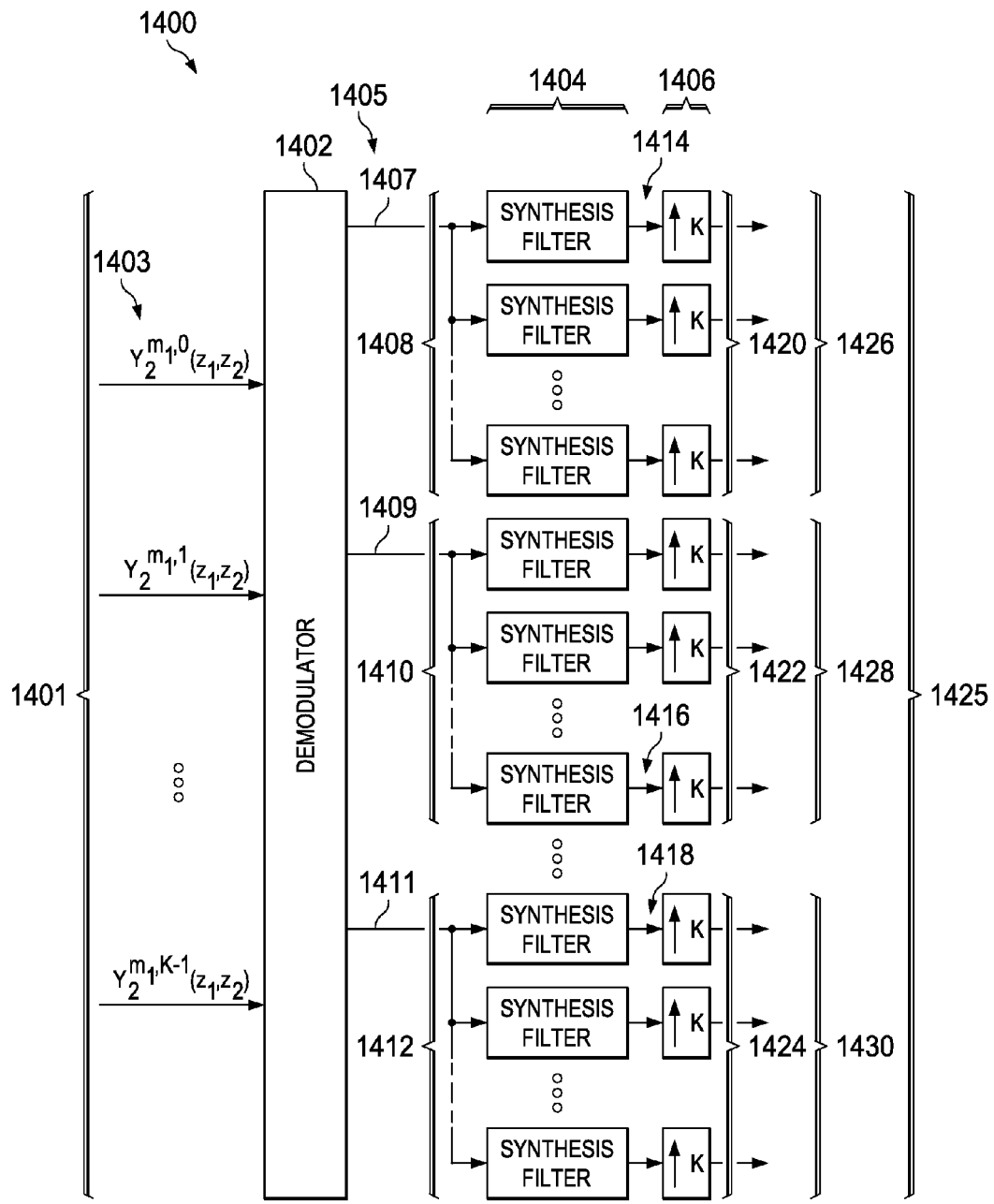
FIG. 14 is an illustration of a functional block diagram of a first portion of a second order synthesis filter bank in accordance with an illustrative embodiment.

With reference now to FIG. 14, an illustration of a functional block diagram of a first portion of a second order synthesis filter bank is depicted in accordance with an illustrative embodiment. In this illustrative example, second order synthesis filter bank 1400 is an example of one implementation for second order synthesis filter bank 1210 in FIG. 12.

Figure 15A:
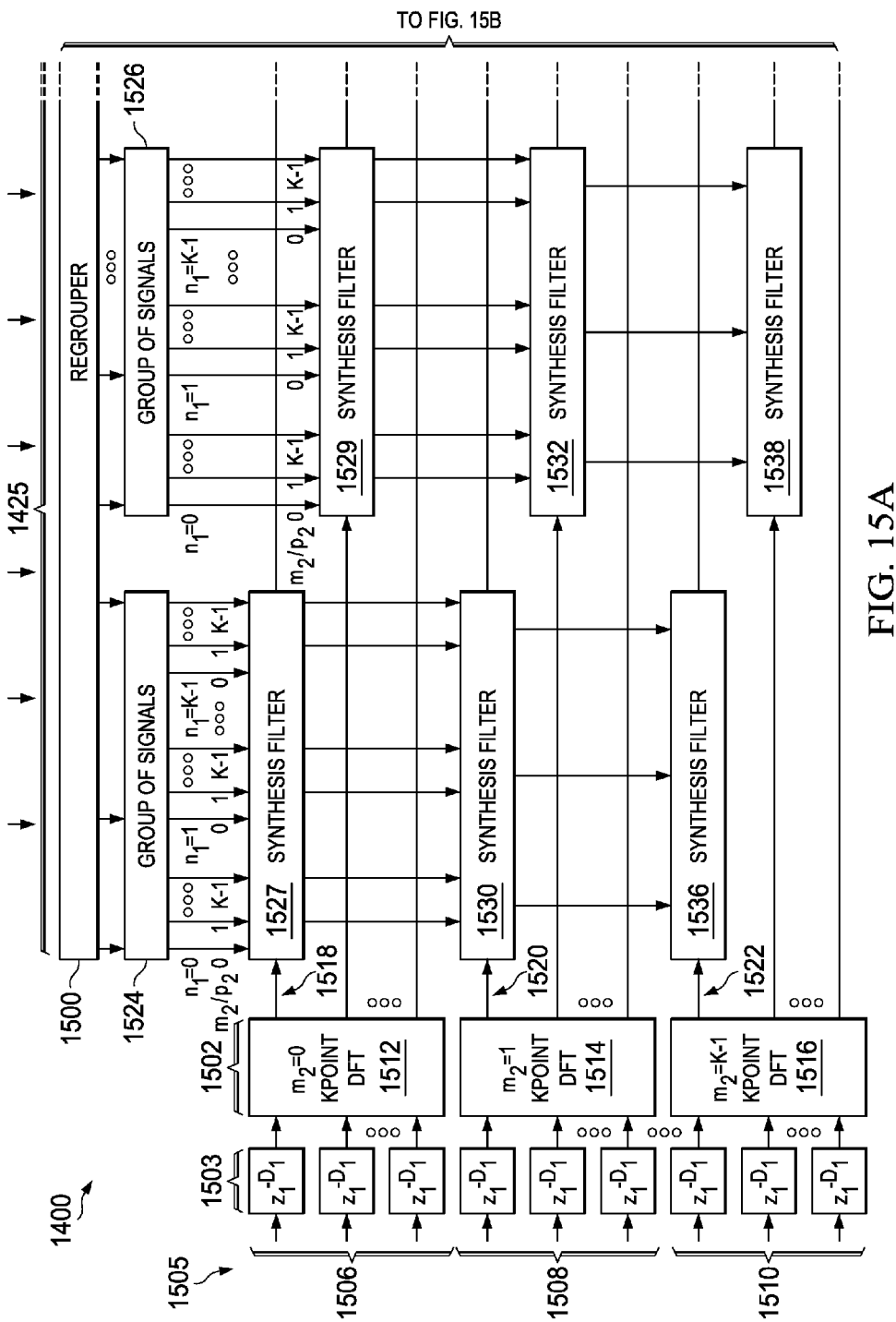
FIGS. 15A and 15B are illustrations of a functional block diagram of a second portion of a second order synthesis filter bank in accordance with an illustrative embodiment.
Figure 15B:
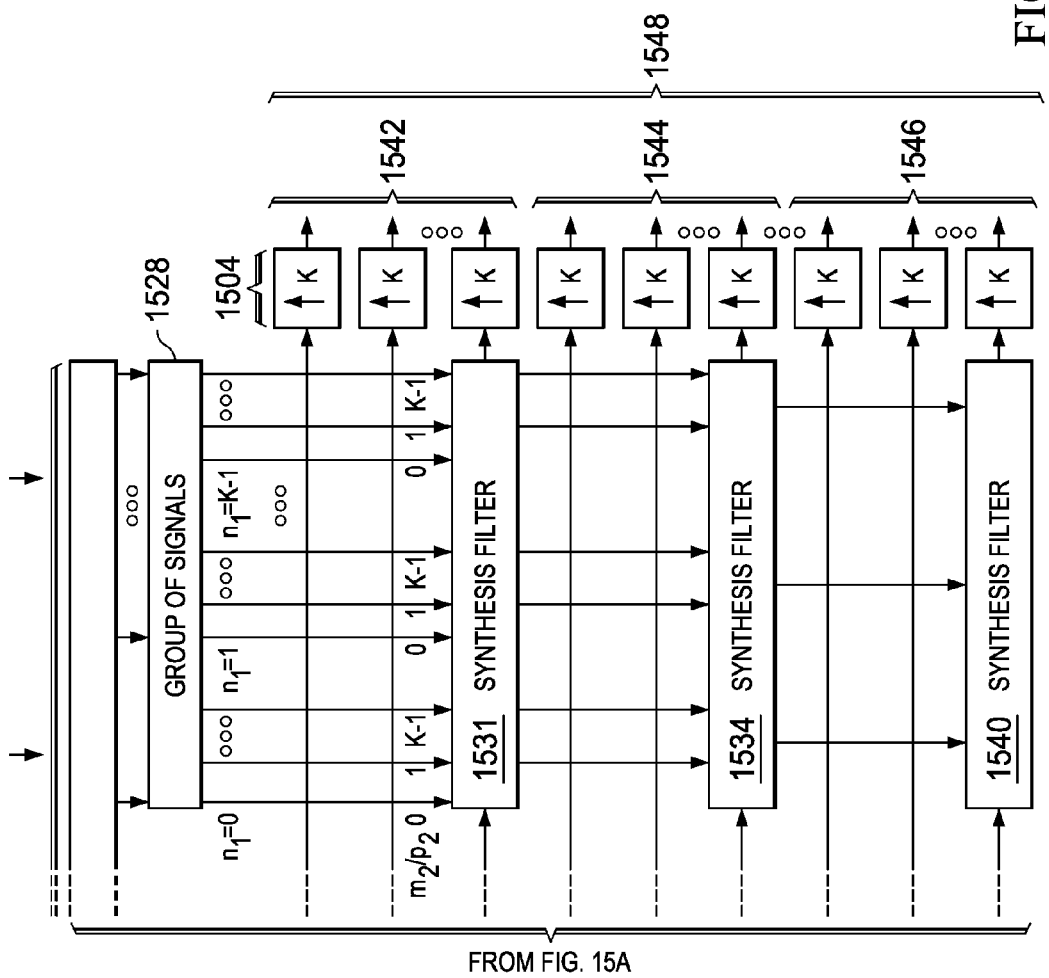

The first portion of second order synthesis filter bank 1400 in FIG. 14 is the portion that performs a first layer of processing. In particular, this first portion of second order synthesis filter bank 1400 forms a first demodulation-filter layer of processing. The second portion of second order synthesis filter bank 1400 that performs the second layer of processing, which is the second demodulation-filter layer of processing, is shown in FIGS. 15A and 15B below.

As depicted, second order synthesis filter bank 1400 includes demodulator 1402, set of synthesis filter subsets 1404, and set of time shifters 1406. Demodulator 1402 may receive second order nonlinear input component 1401. Second order nonlinear input component 1401 may comprise plurality of input subband signals 1403. In response to receiving plurality of input subband signals 1403, demodulator 1402 outputs plurality of demodulated subband signals 1405. Plurality of demodulated subband signals 1405 includes K demodulated subband signals. Demodulator 1402 performs the sub-layer of demodulation for the first demodulation-filter layer of processing for second order synthesis filter bank 1400.

Plurality of demodulated subband signals 1405 may include demodulated subband signal 1407, demodulated subband signal 1409, and demodulated subband signal 1411. Demodulated subband signal 1407, demodulated subband signal 1409, and demodulated subband signal 1411 are sent as input into set of synthesis filter subsets 1404. Set of synthesis filter subsets 1404 includes K subsets. These subsets include subset of synthesis filters 1408, subset of synthesis filters 1410, and subset of synthesis filters 1412. Demodulated subband signal 1407, demodulated subband signal 1409, and demodulated subband signal 1411 are sent as input into subset of synthesis filters 1408, subset of synthesis filters 1410, and subset of synthesis filters 1412, respectively.

Subset of synthesis filters 1408, subset of synthesis filters 1410, and subset of synthesis filters 1412 output set of filtered signals 1414, set of filtered signals 1416, and set of filtered signals 1418, respectively. Set of synthesis filter subsets 1404 performs the sub-layer of filtering for the first demodulation-filter layer of processing for second order synthesis filter bank 1400.

Set of filtered signals 1414, set of filtered signals 1416, and set of filtered signals 1418 are sent as input into subset of up-samplers 1420, subset of up-samplers 1422, and subset of up-samplers 1424, respectively. Subset of up-samplers 1420, subset of up-samplers 1422, and subset of up-samplers 1424 produce output signals 1425. Output signals 1425 may include set of signals 1426, set of signals 1428, and set of signals 1430. Set of signals 1426, set of signals 1428, and set of signals 1430 may be processed using a second portion of second order synthesis filter bank 1400, described in FIGS. 15A and 15B below.

With reference now to FIGS. 15A and 15B, an illustration of a functional block diagram of a second portion of second order synthesis filter bank 1400 from FIG. 14 is depicted in accordance with an illustrative embodiment. The second portion of second order synthesis filter bank 1400 from FIG. 14 performs the second demodulation-filter layer of processing.

As depicted, second order synthesis filter bank 1400 may include regrouper 1500, set of demodulators 1502, set of delay units 1503, and set of up-samplers 1504. In this illustrative example, plurality of versions 1505 of second order nonlinear input component 1401 from FIG. 14 may be used. Plurality of versions 1505 include version 1506, version 1508, and other versions up to $K^{th}$ version 1510. These versions may be substantially the same as second order nonlinear input component 1401 from FIG. 14.

As depicted, a delayed version of each of version 1506, version 1508, and $K^{th}$ version 1510 is formed using set of delay units 1503 and sent as input into demodulator 1512, demodulator 1514, and demodulator 1516, respectively, in set of demodulators 1502. Set of demodulators 1502 performs the sub-layer of demodulation for the second demodulation-filter layer of processing.

In this illustrative example, demodulator 1512, demodulator 1514, and demodulator 1516 output set of demodulated signals 1518, set of demodulated signals 1520, and set of demodulated signals 1522, respectively. The demodulated signals in these sets of demodulated signals may be combined with the output of the first demodulation-layer of processing formed in FIG. 14. In particular, the demodulated signals in these sets of demodulated signals may be combined with the outputs of regrouper 1500.

Regrouper 1500 is configured to rearrange output signals 1425 from FIG. 14 to form K groups of signals. These K groups of signals may include group of signals 1524, group of signals 1526, and group of signals 1528.

In particular, each of the K groups of signals may include K sub-groups of signals in which each sub-group includes K signals. The grouping may be based on the indices of $m_1$, $n_1$, and $m_2$. For example, group of signals 1524 may be the portion of output signals 1425 from FIG. 14 having $m_1$ equal to 0. Group of signals 1524 may include K sub-groups of signals in which each sub-group corresponds to a particular $n_1$, where $n_1$ may be selected from 0 to K−1. Each sub-group of signals may include K signals, where each signal corresponds to a particular $m_2$, where $m_2$ may be selected from 0 to K−1.

Similarly, group of signals 1526 may be the portion of output signals 1425 from FIG. 14 having $m_1$ equal to 1. Group of signals 1526 may include K sub-groups of signals in which each sub-group corresponds to a particular $n_1$, where $n_1$ may be selected from 0 to K−1. Each sub-group of signals may include K signals, where each signal corresponds to a particular $m_2$, where $m_2$ may be selected from 0 to K−1.

In this manner, group of signals 1528 may be the portion of output signals 1425 from FIG. 14 having $m_1$ equal to K−1. Group of signals 1528 may include K sub-groups of signals in which each sub-group corresponds to a particular $n_1$, where $n_1$ may be selected from 0 to K−1. Each sub-group of signals may include K signals, where each signal corresponds to a particular $m_2$, where $m_2$ may be selected from 0 to K−1.

In particular, a corresponding signal from each of set of signals 1426, set of signals 1428, and set of signals 1430 is used to form a particular group. In this manner, each of group of signals 1524, group of signals 1526, and group of signals 1528 may include a corresponding signal from each of set of signals 1426, set of signals 1428, and set of signals 1430. Each signal in a particular group of signals is multiplied by a corresponding demodulated signal or a time-delayed version of that corresponding demodulated signal from a corresponding one of the different sets of demodulated signals.

For example, each signal in one portion of group of signals 1524 may be multiplied by a corresponding demodulated signal or a time-delayed version of that corresponding demodulated signal in set of demodulated signals 1518. Further, each signal in another portion of group of signals 1524 may be multiplied by a corresponding demodulated signal or a time-delayed version of that corresponding demodulated signal in set of demodulated signals 1520. Still further, each signal in yet another portion of group of signals 1524 may be multiplied by a corresponding demodulated signal or a time-delayed version of that corresponding demodulated signal in set of demodulated signals 1518.

Consequently, each demodulated signal formed by set of demodulators 1502 may be filtered. In particular, each demodulated signal in a set of demodulated signals may be filtered using each of the groups of signals formed by regrouper 1500 to form a set of filtered signals. This filtering may form the sub-layer of filtering for the second demodulation-filter layer of processing. This sub-layer of filtering may be performed using synthesis filter 1527, synthesis filter 1529, synthesis filter 1530, synthesis filter 1531, synthesis filter 1532, synthesis filter 1534, synthesis filter 1536, synthesis filter 1538, and synthesis filter 1540.

For example, synthesis filter 1527 may be used to multiply a corresponding demodulated signal in set of demodulated signals 1518 and each of the K−1 time-delayed versions of that corresponding demodulated signal by a corresponding portion of group of signals 1524. After multiplication, the resulting signals are combined to form a filtered signal in set of filtered signals 1542.

Synthesis filter 1529 may be used to multiply a corresponding demodulated signal in set of demodulated signals 1518 and each of the the K−1 time-delayed versions of that corresponding demodulated signal by a corresponding portion of group of signals 1526. After multiplication, the resulting signals are combined to form a filtered signal in set of filtered signals 1542. Further, synthesis filter 1531 may be used to multiply a corresponding demodulated signal in set of demodulated signals 1518 and each of the K−1 time-delayed versions of that corresponding demodulated signal by a corresponding portion of group of signals 1528. After multiplication, the resulting signals are combined to form a filtered signal in set of filtered signals 1542.

In a similar manner, synthesis filter 1530, synthesis filter 1532, and synthesis filter 1534 may be used to process set of demodulated signals 1520 using group of signals 1524, group of signals 1526, and group of signals 1528, respectively, to form set of filtered signals 1544. Further, synthesis filter 1536, synthesis filter 1538, and synthesis filter 1540 may be used to process set of demodulated signals 1522 using group of signals 1524, group of signals 1526, and group of signals 1528, respectively, to form set of filtered signals 1546.

Set of filtered signals 1546 may be a $K^{th}$ set of filtered signals. Set of filtered signals 1542, set of filtered signals 1544, and any other sets of filtered signals up to the $K^{th}$ set of filtered signals 1546 may together form filtered signals 1548. Filtered signals 1548 may be regrouped as described in in FIGS. 16A and 16B below.

Figure 16B:
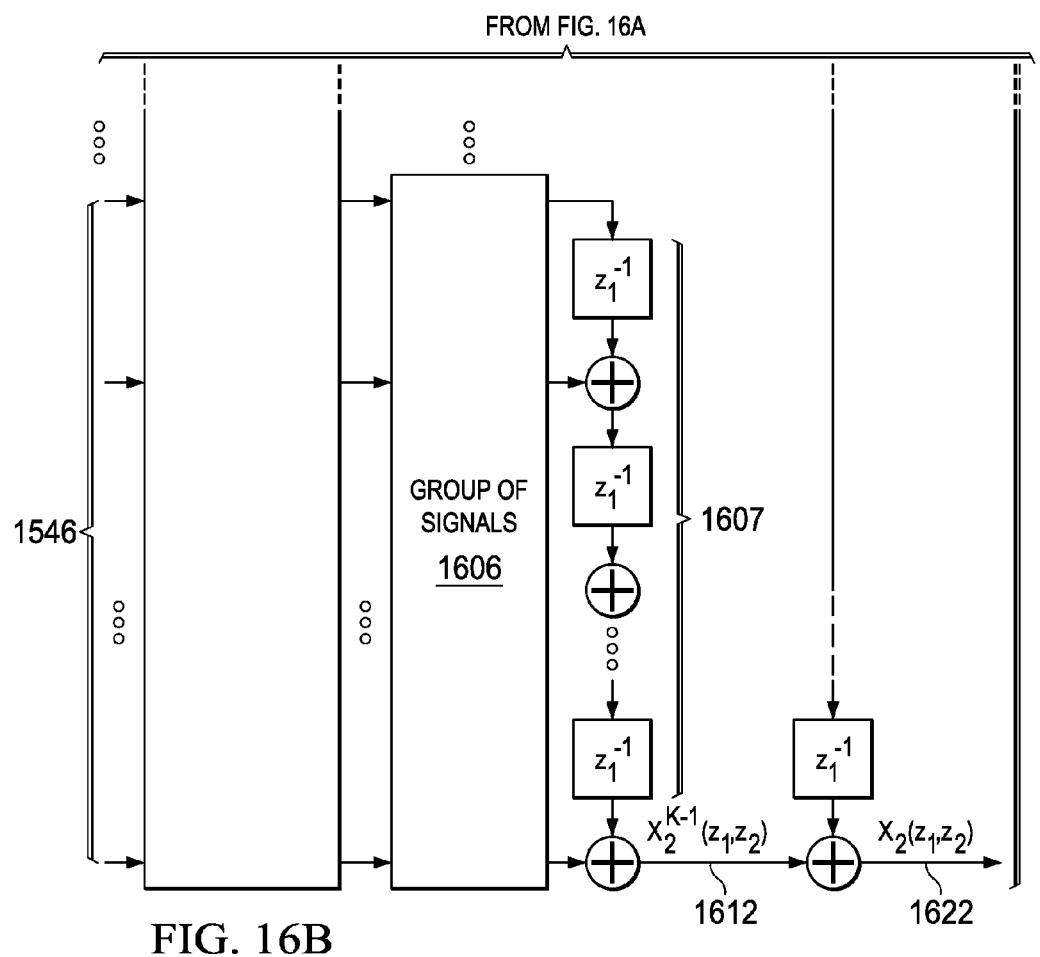

With reference now to FIGS. 16A and 16B, an illustration of a functional block diagram of a third portion of second order synthesis filter bank 1400 from FIGS. 14-15 is depicted in accordance with an illustrative embodiment. As depicted, the third portion of second order synthesis filter bank 1400 includes regrouper 1600 and time shifters 1601.

In this illustrative example, regrouper 1600 receives filtered signals 1548 formed in FIG. 15B. Filtered signals 1548 include set of filtered signals 1542, set of filtered signals 1544, and set of filtered signals 1546 formed in FIG. 15B.

Regrouper 1600 rearranges corresponding signals in these sets of filtered signals to form K groups of signals. These K groups of signals include group of signals 1602, group of signals 1604, and any other groups of to the $K^{th}$ group of signals 1606. The regrouping may be performed based on indices $m_1$ and $m_2$. For example, group of signals 1602 may include K signals corresponding to $m_1$ equal to 0. Each of these K signals may correspond to a particular $m_2$, where $m_2$ may be selected from 0 to K−1. Similarly, group of signals 1604 may include K signals corresponding to $m_1$ equal to 1. Each of these K signals may correspond to a particular $m_2$, where $m_2$ may be selected from 0 to K−1. Further, group of signals 1606 may include K signals corresponding to $m_1$ equal to K−1. Each of these K signals may correspond to a particular $m_2$, where $m_2$ may be selected from 0 to K−1.

As depicted, time shifters 1601 include set of time shifters 1603, set of time shifters 1605, set of time shifters 1607, and final set of time shifters 1611. In this illustrative example, group of signals 1602 are time shifted using set of time shifters 1603 and combined to form signal 1608. Group of signals 1604 are time shifted using set of time shifters 1605 and combined to form signal 1610. Group of signals 1606 are time shifted using set of time shifters 1607 and combined to form signal 1612.

Signal 1608 and signal 1610 are then time shifted using final set of time shifters 1611 and then combined with signal 1612 to form second order output component 1622. Second order output component 1622 may be the portion of the final output signal formed by the overall synthesis filter system generated for the second order nonlinear input component. For example, second order output component 1622 may be an example of the second order output component that would be formed by second order synthesis filter bank 1210 in FIG. 12 and used to form the final output signal 1206.

The second order synthesis filter bank shown in FIGS. 14-16 may be represented as follows:

$$G_2^{m_1,m_2}(z_1, z_2) = \sum_{p_1=K-1}^{0} z_1^{-p_1} W_K^{-m_1 p_1} \sum_{n_1=0}^{N_1-1} z_1^{-n_1 K} \quad (39)$$
$$\sum_{p_2=K-1}^{0} z_2^{-p_2} W_K^{-m_2 p_2} \sum_{n_2=0}^{N_2-1} h_2[n_1 K + p_1, n_2 K + p_2] z_2^{-n_2 K}$$

where the first layer of processing is represented as follows:

$$S_2^{t_1,p_2}(z_2^K) = \sum_{n_2=0}^{N_2-1} h_2[t_1, n_2 K + p_2] z_2^{-n_2 K} \quad (40)$$

$$G_2^{m_2}(t_1, z_2) = \sum_{p_2=K-1}^{0} W_K^{-m_2 p_2} S_2^{t_1,p_2}(z_2^K) z_2^{-p_2} \quad (41)$$

and where the second layer of processing is represented as follows:

$$S_2^{p_1,m_2}(z_1^K, z_2^K) = \sum_{n_1=0}^{N_1-1} G_2^{m_2}(n_1 K + p_1, z_2) \quad (42)$$

$$G_2^{m_1,m_2}(z_1, z_2) = \sum_{p_1=K-1}^{0} W_K^{-m_1 p_1} S_2^{p_1,m_2}(z_1^K, z_2^K) z_1^{-p_1}. \quad (43)$$

A third order synthesis filter bank, such as third order synthesis filter bank 1212 in FIG. 12 may be implemented in a manner similar to second order synthesis filter bank 1400 in FIGS. 14-16 but using three layers of processing. In particular, the third order synthesis filter bank may be implemented using three demodulation-filter layers of processing.

An implementation of this third order synthesis filter bank may be represented as follows:

$$G_3^{m_1,m_2,m_3}(z_1,z_2,z_3) = \sum_{p_1=K-1}^{0} z_1^{-p_1} W_K^{-m_1 p_1} \quad (44)$$

$$\sum_{n_1=0}^{N_1-1} z_1^{-n_1 K} \sum_{p_2=K-1}^{0} z_2^{-p_2} W_K^{-m_2 p_3} \sum_{n_2=0}^{N_2-1} z_2^{-n_2 K} \sum_{p_3=K-1}^{0} z_3^{-p_3} W_K^{-m_3 p_3}$$

$$\sum_{n_3=0}^{N_3-1} h_3[n_1 K + p_1, n_2 K + p_2, n_3 K + p_3] z_3^{-n_3 K}$$

where the first layer of processing is represented as follows:

$$S_3^{t_1,t_2,p_3}(z_3^K) = \sum_{n_3=0}^{N_3-1} h_3[t_1, t_2, n_3 K + p_3] z_3^{-n_3 K} \quad (45)$$

$$G_3^{m_3}(t_1,t_2,z_3) = \sum_{p_3=K-1}^{0} W_K^{-m_3 p_3} S_3^{t_1,t_2,p_3}(z_3^K) z_3^{-p_3} \quad (46)$$

where the second layer of processing is represented as follows:

$$S_3^{t_1,p_2,m_3}(z_2^K, z_3^K) = \sum_{n_2=0}^{N_2-1} G_3^{m_3}(t_1, n_2 K + p_2, z_3) z_2^{-n_2 K} \quad (47)$$

$$G_3^{m_2,m_3}(t_1,z_2,z_3) = \sum_{p_2=K-1}^{0} W_K^{-m_2 p_2} S_3^{t_1,p_2,m_3}(z_2^K, z_3^K) z_3^{-p_2}, \text{ and} \quad (48)$$

where the third layer of processing is represented as follows:

$$S_3^{p_1,m_2,m_3}(z_1^K, z_2^K, z_3^K) = \sum_{n_1=0}^{N_1-1} G_3^{m_2,m_3}(n_1 K + p_1, z_2, z_3) z_1^{-n_1 K} \quad (49)$$

$$G_3^{m_1,m_2,m_3}(z_1,z_2,z_3) = \sum_{p_1=K-1}^{0} W_K^{-m_1 p_1} S_3^{p_1,m_2,m_3}(z_1^K, z_2^K, z_3^K) z_1^{-p_1}. \quad (50)$$

In this manner, an $i^{th}$ order synthesis filter bank in plurality of synthesis filter banks 1202 in FIG. 12 may be used to form an $i^{th}$ order output component using the nonlinear input component received at the $i^{th}$ order synthesis filter bank. The nonlinear input component may be an $i^{th}$ order input component comprising a plurality of $i^{th}$ order subband signals for the selected frequency subbands.

The $i^{th}$ order output component may be formed by performing a number of layers of processing using the plurality of $i^{th}$ order subband signals. Each of the number of layers of processing may include a sub-layer of demodulation and a subsequent sub-layer of filtering. The number of layers of processing is equal in number to i.

Figure 17:
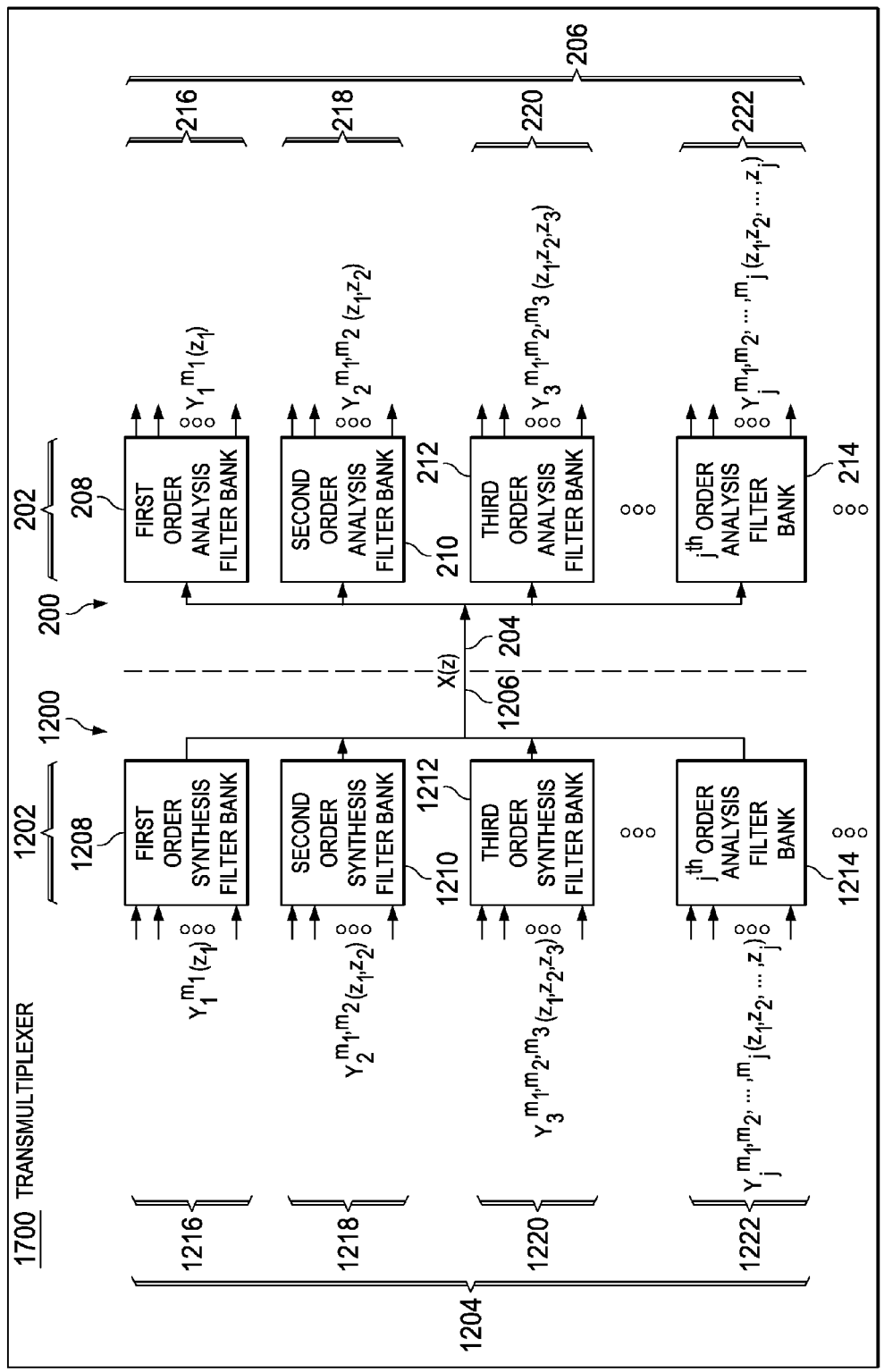
FIG. 17 is an illustration of a functional block diagram of a transmultiplexer for a transceiver in accordance with an illustrative embodiment.

With reference now to FIG. 17, an illustration of a functional block diagram of a transmultiplexer for a transceiver is depicted in accordance with an illustrative embodiment. In this illustrative example, synthesis filter system 1200 from FIG. 12 and analysis filter system 200 from FIG. 2 have been combined to form transmultiplexer 1700. Transmultiplexer 1700 may be used in, for example, a transceiver.

In this illustrative example, synthesis filter system 1200 synthesizes output signal 1206 according to selected requirements using plurality of nonlinear input components 1204. Output signal 1206 may then be converted into a real-world analog signal and transmitted using a transmitter. This analog signal may be received using a receiver and converted into input signal 204. Input signal 204 may then be decomposed into plurality of nonlinear components 206 for analysis.

Figure 18:
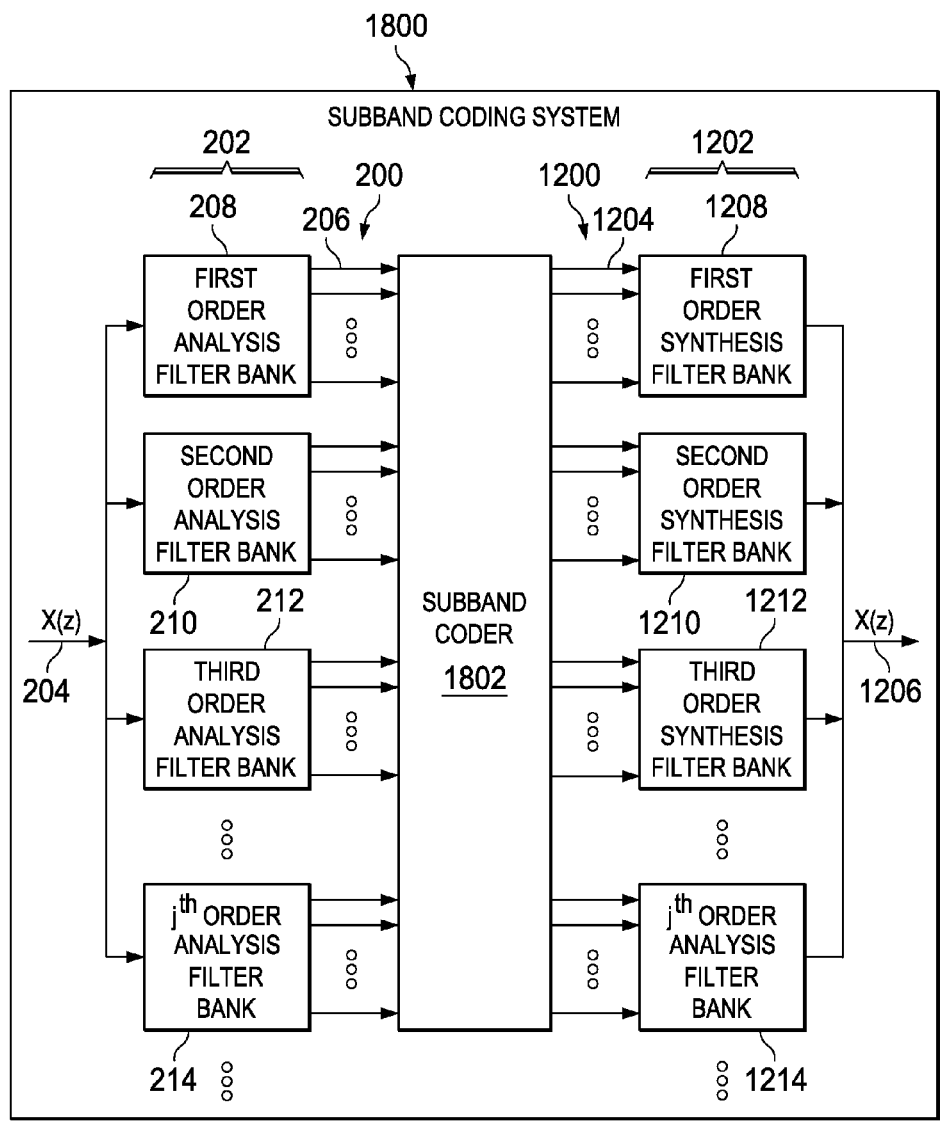
FIG. 18 is an illustration of a functional block diagram of a subband coding system for a transceiver in accordance with an illustrative embodiment.

With reference now to FIG. 18, an illustration of a functional block diagram of a subband coding system is depicted in accordance with an illustrative embodiment. In this illustrative example, synthesis filter system 1200 from FIG. 12 and analysis filter system 200 from FIG. 2 have been combined to form subband coding system 1800. Subband coding system 1800 may be used to, for example, without limitation, encode information onto a signal.

In this illustrative example, analysis filter system 200 may decompose input signal 204 into plurality of nonlinear components 206. Plurality of nonlinear components 206 may be sent into subband coder 1802. Subband coder 1802 may be used to encode information onto the different subband signals that form plurality of nonlinear components 206. Analysis filter system 200 allows subband coder 1802 to encode information with respect to the different orders of nonlinearity.

Subband coder 1802 forms encoded subband signals for the different orders of nonlinearity. These signals may form plurality of nonlinear input components 1204 that may then be synthesized using synthesis filter system 1200 into output signal 1206. Output signal 1206 may then be, for example, transmitted as an analog signal.

The illustrations of functional block diagrams in FIGS. 2-18 are not meant to imply physical or architectural limitations to the manner in which an illustrative embodiment may be implemented. Other components in addition to or in place of the ones illustrated may be used. Some components may be optional.

The different components shown in FIGS. 2-18 may be illustrative examples of how components shown in block form in FIG. 1 can be implemented. Additionally, some of the components in FIGS. 2-18 may be combined with components in FIG. 1, used with components in FIG. 1, or a combination of the two.

Figure 19:
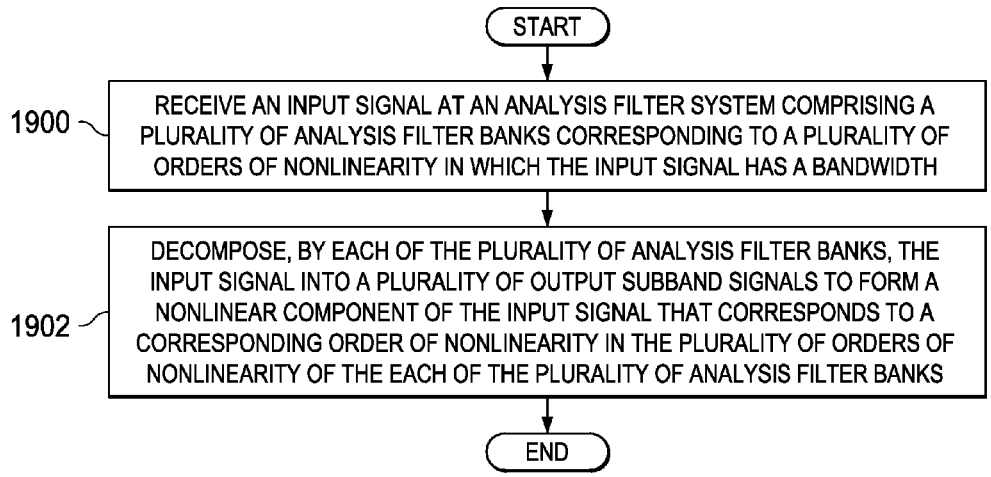
FIG. 19 is an illustration of a process for analyzing an input signal in the form of a flowchart in accordance with an illustrative embodiment.

With reference now to FIG. 19, an illustration of a process for analyzing an input signal is depicted in the form of a flowchart in accordance with an illustrative embodiment. The process illustrated in FIG. 19 may be implemented using analysis filter system 102 in FIG. 1.

The process begins by receiving an input signal at an analysis filter system comprising a plurality of analysis filter banks corresponding to a plurality of orders of nonlinearity in which the input signal has a bandwidth (operation 1900). Next, the input signal is decomposed by each of the plurality of analysis filter banks into a plurality of output subband signals to form a nonlinear component of the input signal that corresponds to a corresponding order of nonlinearity in the plurality of orders of nonlinearity of the each of the plurality of analysis filter banks (operation 1902), with the process terminating thereafter.

In operation 1902, each of the plurality of output subband signals is for a different frequency subband within the bandwidth of the input signal. In operation 1902, an $i^{th}$ order analysis filter bank in the plurality of analysis filter banks corresponding to an $i^{th}$ order of nonlinearity may decompose the input signal into a plurality of $i^{th}$ order subband signals to form an $i^{th}$ order nonlinear component of the input signal.

Figure 20:
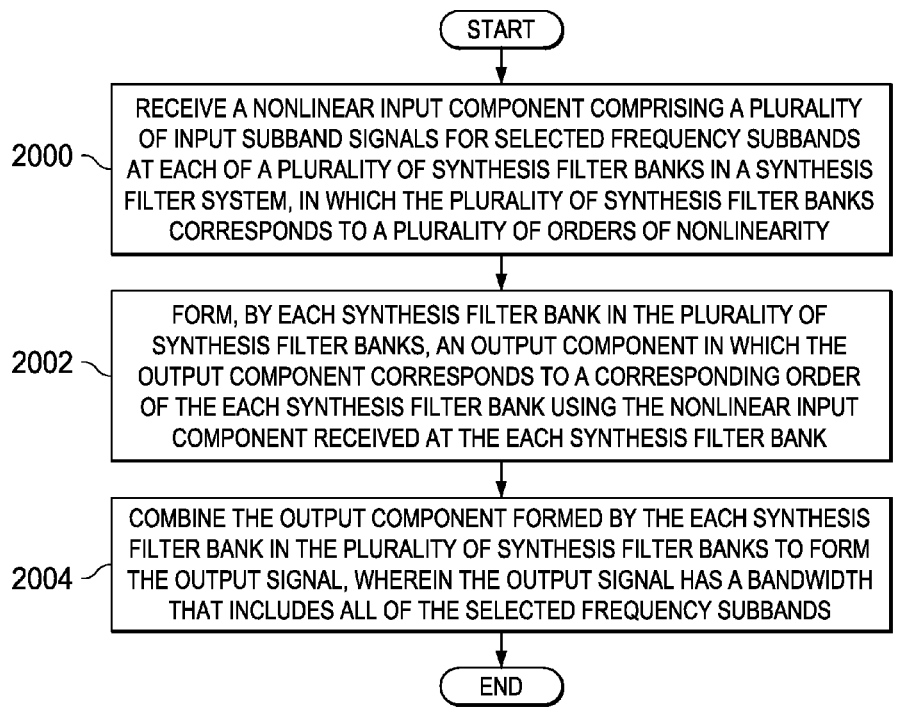
FIG. 20 is an illustration of a process for synthesizing an output signal in the form of a flowchart in accordance with an illustrative embodiment.

With reference now to FIG. 20, an illustration of a process for synthesizing an output signal in the form of a flowchart in accordance with an illustrative embodiment. The process illustrated in FIG. 20 may be implemented using analysis filter system 102 in FIG. 1.

The process begins by receiving a nonlinear input component comprising a plurality of input subband signals for selected frequency subbands at each of a plurality of synthesis filter banks in a synthesis filter system in which the plurality of synthesis filter banks corresponds to a plurality of orders of nonlinearity (operation 2000). Next, an output component is formed by each synthesis filter bank in the plurality of synthesis filter banks in which the output component corresponds to a corresponding order of the each synthesis filter bank using the nonlinear input component received at the each synthesis filter bank (operation 2002).

Thereafter, the output component formed by each synthesis filter bank in the plurality of synthesis filter banks is combined to form the output signal, wherein the output signal has a bandwidth that includes all of the selected frequency subbands (operation 2004), with the process terminating thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, a portion of an operation or step, some combination thereof.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

In this manner, the illustrative embodiments provide a method for signal analysis, signal synthesis, and harmonic separation that may be used for nonlinear systems. Analysis filter system 102 and synthesis filter system 104 described in FIG. 1 may allow processing of nonlinear systems with respect to different frequency subbands.

In particular, nonlinear filter system 101 in FIG. 1 may be a filter system for a nonlinear system. Nonlinear filter system 101 may comprise a plurality of polyphase filter banks corresponding to a plurality of orders of nonlinearity. Each of the plurality of polyphase filter banks may be configured to process an input signal with respect to a plurality of selected frequency subbands to generate an output signal that corresponds to a corresponding order of the each of the plurality of polyphase filter banks. The nonlinear filter system may include an analysis filter system, such as analysis filter system 102 in FIG. 1, a synthesis filter system, such as synthesis filter system 104 in FIG. 1, or both.

When the nonlinear filter system includes an analysis filter system, the plurality of polyphase filter banks may include a plurality of analysis filter banks. An $i^{th}$ order analysis filter bank in the plurality of analysis filter banks corresponds to an $i^{th}$ order of nonlinearity. The $i^{th}$ order analysis filter bank may be configured to decompose an input signal into a plurality of $i^{th}$ order subband signals to form an $i^{th}$ order nonlinear component of the input signal. In this example, i is an index between 1 and j.

When the nonlinear filter system includes a synthesis filter system, the plurality of polyphase filter banks may include a plurality of synthesis filter banks. An $i^{th}$ order synthesis filter bank in the plurality of synthesis filter banks may be configured to receive an $i^{th}$ order input component comprising a plurality of $i^{th}$ order subband signals for the selected frequency subbands and form an $i^{th}$ order output component using the plurality of $i^{th}$ order subband signals. In this example, i is an index having a value between 1 and j.

Both an analysis filter system and a synthesis filter system as described above may be used to implement a transmultiplexer or a subband coder. In either the transmultiplexer or the subband coder, the analysis filter system may comprise a plurality of polyphase analysis filter banks corresponding to a plurality of orders of nonlinearity and a synthesis filter system comprising a plurality of polyphase synthesis filter banks corresponding to the plurality of orders of nonlinearity.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for analyzing an input signal, the method comprising:
   receiving the input signal at an analysis filter system comprising a plurality of analysis filter banks corresponding to a plurality of orders of nonlinearity, wherein the input signal has a bandwidth; and
   decomposing, by each of the plurality of analysis filter banks, the input signal into a plurality of output subband signals to form a nonlinear component of the input signal that corresponds to a corresponding order of nonlinearity in the plurality of orders of nonlinearity of the each of the plurality of analysis filter banks, wherein each of the plurality of output subband signals is for a different frequency subband within the bandwidth of the input signal.

2. The method of claim 1, wherein decomposing, by the each of the plurality of analysis filter banks, the input signal into the plurality of output subband signals comprises:
   decomposing, by a first order analysis filter bank in the plurality of analysis filter banks corresponding to a first order of nonlinearity, the input signal into a plurality of first order subband signals to form a first order nonlinear component of the input signal.

3. The method of claim 1, wherein decomposing, by the each of the plurality of analysis filter banks, the input signal into the plurality of output subband signals comprises:
   decomposing, by a second order analysis filter bank in the plurality of analysis filter banks corresponding to a second order of nonlinearity, the input signal into a plurality of second order subband signals to form a second order nonlinear component of the input signal.

4. The method of claim 1, wherein decomposing, by the each of the plurality of analysis filter banks, the input signal into the plurality of output subband signals comprises:
   decomposing, by an $i^{th}$ order analysis filter bank in the plurality of analysis filter banks corresponding to an $i^{th}$ order of nonlinearity, the input signal into a plurality of $i^{th}$ order subband signals to form an $i^{th}$ order nonlinear component of the input signal.

5. The method of claim 4, wherein decomposing, by the $i^{th}$ order analysis filter bank in the plurality of analysis filter banks corresponding to the $i^{th}$ order of nonlinearity, the input signal into the plurality of $i^{th}$ order subband signals to form the $i^{th}$ order component of the input signal comprises:

performing a number of layers of processing to form the plurality of $i^{th}$ order subband signals, wherein each of the number of layers includes a sub-layer of filtering and a subsequent sub-layer of modulation and wherein the number of layers is equal in number to i.

6. The method of claim 1 further comprising:

receiving an analog signal at an analog to digital converter; and converting the analog signal into a digital signal using the analog to digital converter to form the input signal.

7. An apparatus comprising:

a plurality of polyphase filter banks corresponding to a plurality of orders of nonlinearity, wherein each of the plurality of polyphase filter banks is configured to process an input signal with respect to a plurality of selected frequency subbands to generate an output signal that corresponds to a corresponding order of the each of the plurality of polyphase filter banks, wherein: the plurality of polyphase filter banks comprises: 1) a first plurality of polyphase discrete Fourier transform (DFT) analysis filter banks and 2) a second plurality of polyphase DFT synthesis filter banks; and a processor configured to combine a first result of operation of the first plurality and a second result of operation of the second plurality to create a combined signal.

8. The apparatus of claim 7, wherein the plurality of polyphase filter banks is selected from one of a plurality of analysis filter banks that form an analysis filter system and a plurality of synthesis filter banks that form a synthesis filter system.

9. The apparatus of claim 8, wherein each of the plurality of analysis filter banks is configured to decompose the input signal into a plurality of output subband signals to form a nonlinear component of the input signal that corresponds to a corresponding order of nonlinearity in the plurality of orders of nonlinearity of the each of the plurality of analysis filter banks and wherein each of the plurality of output subband signals is for a different frequency subband within a bandwidth of the input signal.

10. The apparatus of claim 9, wherein the plurality of analysis filter banks comprises:

a first order analysis filter bank corresponding to a first order of nonlinearity, wherein the first order analysis filter bank is configured to decompose the input signal into a plurality of first order subband signals to form a first order nonlinear component of the input signal; and an $i^{th}$ order analysis filter bank corresponding to an $i^{th}$ order of nonlinearity, wherein the $i^{th}$ order analysis filter bank is configured to decompose the input signal into a plurality of $i^{th}$ order subband signals to form an $i^{th}$ order nonlinear component of the input signal.

11. The apparatus of claim 10, wherein the $i^{th}$ order analysis filter bank comprises:

a plurality of filter-modulation layers equal in number to i wherein a particular layer in the plurality of filter-modulation layers comprises:

a plurality of filters equal in number to K subbands; and a set of modulators having a number corresponding to an index of the particular layer and K.

12. The apparatus of claim 8, wherein each of the plurality of synthesis filter banks is configured to receive a nonlinear input component comprising a plurality of input subband signals for selected frequency subbands and form an output component that corresponds to a corresponding order of each synthesis filter bank using the nonlinear input component received and wherein the output component formed by the each synthesis filter bank in the plurality of synthesis filter banks is combined to form an output signal having a bandwidth that includes all of the selected frequency subbands.

13. The apparatus of claim 12, wherein the plurality of synthesis filter banks comprises:

a first order synthesis filter bank configured to receive a first order input component comprising a plurality of first order subband signals for the selected frequency subbands and form a first order output component using the plurality of first order subband signals; and an $i^{th}$ order synthesis filter bank configured to receive an $i^{th}$ order input component comprising a plurality of $i^{th}$ order subband signals for the selected frequency subbands and form an $i^{th}$ order output component using the plurality of $i^{th}$ order subband signals.

14. The apparatus of claim 13, wherein the $i^{th}$ order synthesis filter bank comprises:

a plurality of modulation-filter layers equal in number to i, wherein a particular layer in the plurality of modulation-filter layers comprises:

a set of modulators having a number corresponding to an index of the particular layer and K; and a plurality of filters equal in number to K, wherein K is a total number of the selected frequency subbands and wherein each of the plurality of filters is configured to form a filtered signal.

15. The apparatus of claim 7, wherein the first plurality and the second plurality comprise Volterra filter banks.

16. The apparatus of claim 7 further comprising:

a transmultiplexer configured to perform nonlinear transmultiplexing to convert time multiplexed components of the signal to frequency multiplexed components of the signal.

17. The apparatus of claim 7 further comprising:

a subband coder configured to perform subband coding to decompose the signal into different frequency components and the subsequent encoding of those frequency components.

18. The apparatus of claim 7 further comprising:

a transmultiplexer configured to perform nonlinear transmultiplexing to convert time multiplexed components of the combined signal to frequency multiplexed components of the signal; and a subband coder configured to perform subband coding of the combined signal to decompose the combined signal into different frequency components and the subsequent encoding of those frequency components.

19. A method for analyzing an input signal, the method comprising:

receiving the input signal at an analysis filter system comprising a plurality of analysis filter banks corresponding to a plurality of orders of nonlinearity, wherein the input signal has a bandwidth, and wherein the plurality of polyphase filter banks comprises: 1) a first plurality of polyphase discrete Fourier transform (DFT) analysis filter banks and 2) a second plurality of polyphase DFT synthesis filter banks;

decomposing, by the first plurality of polyphase DFT analysis filter banks, the input signal into a plurality of output subband signals to form a nonlinear component of the input signal that corresponds to a corresponding order of nonlinearity in the plurality of orders of nonlinearity of the each of the plurality of analysis filter banks, wherein each of the plurality of output subband signals is for a different frequency subband within the bandwidth of the input signal;

synthesizing the input signal into a plurality harmonic interference signals having defined frequency bands and harmonic interference; and combining the plurality of output subband signals and the plurality of harmonic interference signals into a combined signal.

20. The method of claim 19 further comprising one or both of:

performing nonlinear transmultiplexing to convert time multiplexed components of the combined signal to frequency multiplexed components of the signal; and subband coding the combined signal to decompose the combined signal into different frequency components and the subsequent encoding of those frequency components.

* * * * *